United States Patent
Steiner

(10) Patent No.: US 10,607,709 B1
(45) Date of Patent: Mar. 31, 2020

(54) SYSTEM AND METHOD FOR EFFICIENT READ-FLOW BY INTER-CELL INTERFERENCE DECOUPLING FOR NAND FLASH MEMORIES

(71) Applicant: Toshiba Memory Corporation, Tokyo (JP)

(72) Inventor: Avi Steiner, Kiriat Motzkin (IL)

(73) Assignee: Toshiba Memory Corporation, Tokyo (JP)

( * ) Notice: Subject to any disclaimer, the term of this patent is extended or adjusted under 35 U.S.C. 154(b) by 6 days.

(21) Appl. No.: 16/130,773

(22) Filed: Sep. 13, 2018

(51) Int. Cl.
  *G11C 11/00* (2006.01)
  *G11C 16/34* (2006.01)
  *G11C 16/26* (2006.01)
  *G11C 16/04* (2006.01)

(52) U.S. Cl.
  CPC ...... *G11C 16/3427* (2013.01); *G11C 16/0408* (2013.01); *G11C 16/26* (2013.01)

(58) Field of Classification Search
  CPC ............ G11C 11/5642; G11C 11/5628; G11C 16/3418; G11C 16/0483; G11C 16/3427; G11C 16/26; G11C 2211/5621; G11C 16/349; G11C 16/04; G11C 16/10; G11C 16/12; G11C 16/3404; G11C 2211/5642; G11C 29/50004
  See application file for complete search history.

(56) References Cited

U.S. PATENT DOCUMENTS

| | | | | |
|---|---|---|---|---|
| 8,050,086 B2 * | 11/2011 | Shalvi | ............. | G11C 16/26 365/185.02 |
| 8,218,366 B2 * | 7/2012 | Dong | ............. | G11C 11/5628 365/185.02 |
| 2013/0051148 A1 * | 2/2013 | Lee | ............. | G11C 11/5642 365/185.18 |

* cited by examiner

*Primary Examiner* — Hien N Nguyen
(74) *Attorney, Agent, or Firm* — Foley & Lardner LLP

(57) ABSTRACT

A flash memory system may include a cell flash memory having a plurality of threshold voltages, and a circuit for performing operations of the cell flash memory. The circuit may perform a first read operation on a first cell of the cell flash memory with a first threshold voltage among the plurality of threshold voltages, estimate a first interference state relating to the first threshold voltage, estimate a first voltage shift based on the first interference state, and perform a first shifted read operation on the first cell of the cell flash memory with a shifted first threshold voltage shifted with the first voltage shift, generate a first decoder input based on the estimated first interference state and the result of the first shifted read operation on the first cell, and decode, based on the first decoder input, a result of the first read operation on the first cell.

20 Claims, 11 Drawing Sheets

SYSTEM AND METHOD FOR EFFICIENT READ-FLOW BY INTER-CELL INTERFERENCE DECOUPLING FOR NAND FLASH MEMORIES

TECHNICAL FIELD

The present embodiments relate generally to memory devices and more particularly to techniques for obtaining higher endurance and higher average read performance for NAND flash devices by mitigation of interference of adjacent cells.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array may be read. This may be done by applying a bias voltage to all rows not being read and a reference threshold voltage to the row that should be read. The bias voltage may allow the transistor of the NAND flash memory array to fully conduct. The cells lying on the row being read will conduct only if the threshold voltage is sufficiently high to overcome the trapped charge in the floating gate. A sense amplifier may be connected to each string which measures the current through the string and outputs either a "1" or a "0" depending whether the current passed a certain threshold.

As NAND flash memory cell sizes become smaller, the scaling down of the flash memory cell sizes may cause an increase in the parasitic capacitance coupling between neighboring cells (floating gate transistors) in a flash memory block. This phenomenon, called "inter-cell interference" (ICI), may cause errors in flash memories, leading to degradation in endurance and read performance for NAND flash devices.

SUMMARY

The present embodiments relate to methods for obtaining higher endurance and higher average read performance for NAND flash devices by mitigation of interference of adjacent cells.

According to certain aspects, embodiments provide a flash memory system including a cell flash memory having a plurality of threshold voltages, and a circuit for performing operations of the cell flash memory. The circuit may be configured to perform a first read operation on a first cell of the cell flash memory with a first threshold voltage among the plurality of threshold voltages. The circuit may be configured to estimate a first interference state relating to the first threshold voltage. The circuit may be configured to estimate a first voltage shift based on the first interference state. The circuit may be configured to perform a first shifted read operation on the first cell of the cell flash memory with a shifted first threshold voltage shifted with the first voltage shift. The circuit may be configured to generate a first decoder input based on the estimated first interference state and the result of the first shifted read operation on the first cell. The circuit may be configured to decode, based on the first decoder input, a result of the first read operation on the first cell.

According to other aspects, embodiments provide a flash memory system including a cell flash memory having a plurality of threshold voltages, and a circuit for performing operations of the cell flash memory. The circuit may be configured to perform a first read operation on a first cell of the cell flash memory with a first threshold voltage among the plurality of threshold voltages. The circuit may be configured to generate a first plurality of threshold voltage samples corresponding to the first threshold voltage. The circuit may be configured to estimate a first interference state, a second interference state, a third interference state, and a fourth interference state which relate to three threshold voltages other than the first threshold voltage among the plurality of threshold voltages. The circuit may be configured to perform a second read operation on the first cell of the cell flash memory with a second threshold voltage among the plurality of threshold voltages. For each of the first plurality of threshold voltage samples, the circuit may be configured to generate first soft information based on a result of the second read operation and the first estimated interference state, generate second soft information based on the first soft information, the result of the second read operation, and the second estimated interference state, and generate third soft information based on the second soft information, the result of the second read operation, the third estimated interference state and the fourth estimated interference state. The circuit may be configured to decode, based on the third soft information, a result of the first read operation on the first cell.

According to further other aspects, embodiments provide a method for performing operations on a cell flash memory having a plurality of threshold voltages. The method may include performing a first read operation on a first cell of the cell flash memory with a first threshold voltage among the plurality of threshold voltages. A first interference state relating to the first threshold voltage may be estimated. A first voltage shift may be estimated based on the first interference state. A first shifted read operation may be performed on the first cell of the cell flash memory with a shifted first threshold voltage shifted with the first voltage shift. A first decoder input may be generated based on the estimated first interference state and the result of the first shifted read operation on the first cell. A result of the first read operation on the first cell may be decoded based on the first decoder input.

According to further aspects, embodiments provide a method for performing operations on a cell flash memory having a plurality of threshold voltages. The method may include performing a first read operation on a first cell of the cell flash memory with a first threshold voltage among the plurality of threshold voltages. A first plurality of threshold voltage samples may be generated corresponding to the first threshold voltage. A first interference state, a second interference state, a third interference state, and a fourth interference state which relate to three threshold voltages other than the first threshold voltage among the plurality of threshold voltages, may be estimated. A second read operation may be performed on the first cell of the cell flash memory with a second threshold voltage among the plurality of threshold voltages. For each of the first plurality of threshold voltage samples, first soft information may be generated based on a result of the second read operation and the first estimated interference state, second soft information may be generated based on the first soft information, the result of the second read operation, and the second estimated interference state, and third soft information may be generated based on the second soft information, the result of the second read operation, the third estimated interference state and the fourth estimated interference state. A result of the first read operation on the first cell may be decoded based on the third soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
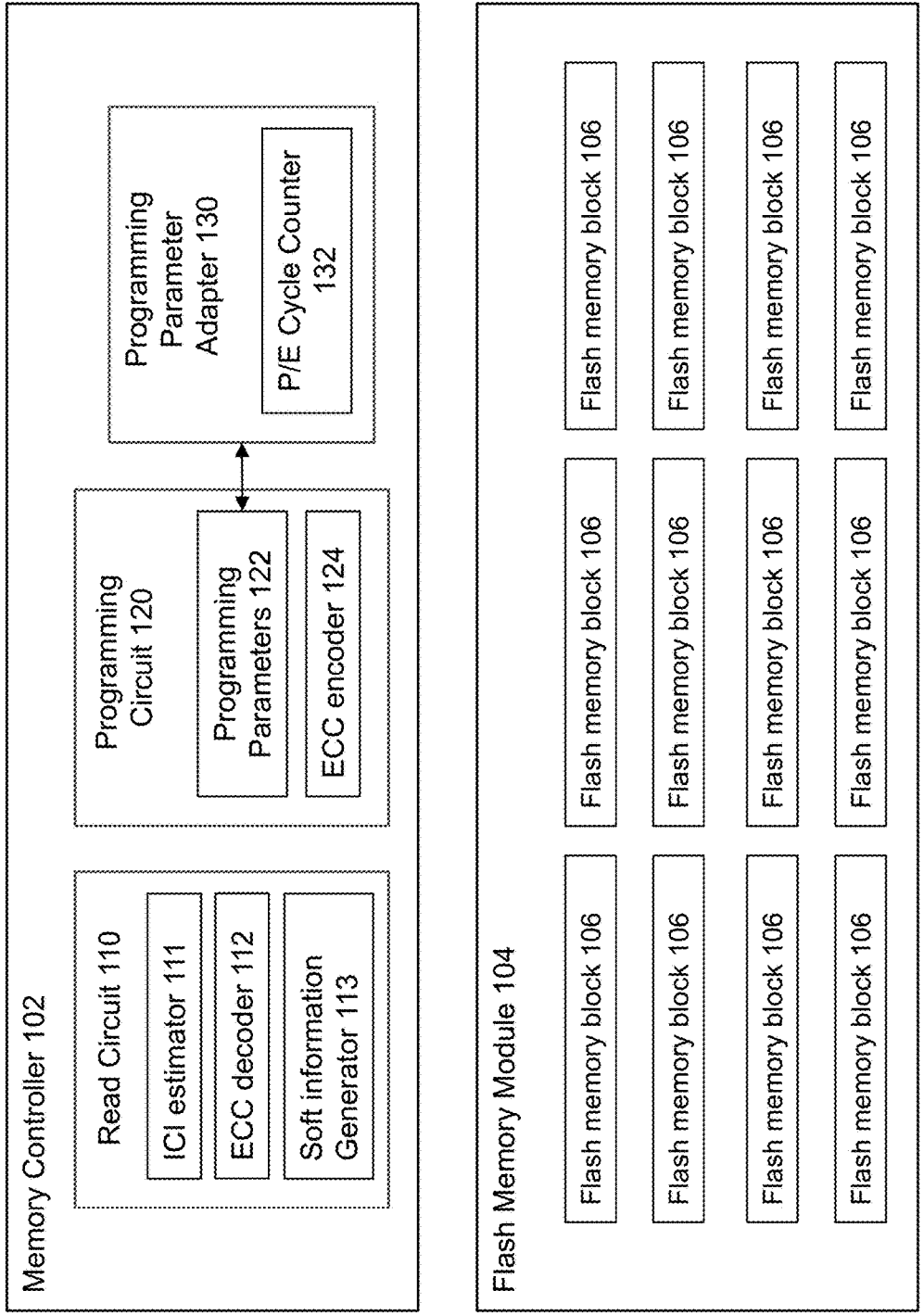
FIG. 1 is a block diagram illustrating an example flash memory system according to some embodiments.

According to certain aspects, embodiments in the present disclosure relate to techniques for decoupling inter-cell interference for NAND flash memory devices so as to provide high endurance and steady reading performance.

Inherent coupling noise between NAND memory cells may occur within planar or three-dimensional (3D) NAND devices. In planar NAND devices, (1) neighboring cells on the same row and (2) neighboring cells on the same column of adjacent row may be dominant contributors to inter-cell interference (ICI). Thus, reliability gains for hard/soft input can be obtained by estimating the states of neighboring cells. In 3D triple-level cell (TLC) NAND devices, ICI coupling may be found on adjacent word-lines.

The main source of interference may be a programming scheme. For example, during a TLC programming, programming of one row may impact a near-by or adjacent row which is already programmed. The cells which are programmed to highest levels may be the source of a stronger interference (than those programmed to levels lower than the highest levels) which may cause unintentional programming of adjacent cells.

In some embodiments in the present disclosure, systems and methods are provided for obtaining higher endurance and higher average read performance for NAND flash devices by mitigation of interference (i.e., ICI) of adjacent cells. In some embodiments, a set of minimal reads may be performed to compute an estimated interference state, and then soft sampling of a target page may be performed. In some embodiments, in performing soft sampling of the target page, interference side information may be utilized for reducing the bit error rate (BER) of the target page and for providing efficient soft decoding. In some embodiments, the cell interference side information may be probability of error in a left side (e.g., left lob tail) or right side (e.g., right lob tail) of a voltage threshold distribution due to interference state of neighboring cells (see FIGS. 2 and 3). In some embodiments, cell interference side information may be obtained from pre-fetch of next page reads or by saving previous read results, depending on interference characteristics. With this configuration, it is possible that no extra reads are actually performed on long sequences of sequential reads. In some embodiments, the systems and methods for mitigation of interference of adjacent cells can be implemented as signal processing operations on a NAND memory controller (see FIG. 1).

The advantages of the systems and methods described in the present disclosure includes (1) reducing the raw BER of a target codeword, i.e., performing hard bit decoding at lower BER by utilizing the interference side information; (2) accurate soft decoding by using soft samples with reduced inter-cell interference (ICI); (3) efficient sampling and soft information generation (e.g., labeling) for compensation of ICI by combining high resolution sampling (e.g., 5-bit soft samples) and interference decoupling based on the interference information, thereby obtaining a lower BER and a refined labeling (e.g., assignments of log-likelihood ratios (LLR)); (4) efficient compression of the soft samples and interference samples by using soft information (e.g., labels); (5) efficient ICI decoupling by manipulation of soft information (e.g., labels); (6) incremental compensation of ICI with multiple single level reads (of neighboring cells) and with minimal buffer requirements; (7) higher read performance (e.g., read throughput) by utilizing pre-fetch of next page reads or by saving previous read results; and (8) higher endurance and better resilience to retention and read-disturb stresses.

FIG. 1 is a block diagram illustrating an example flash memory system 100 according to some embodiments, which can perform any of the methods described in the present disclosure.

The flash system 100 may include a flash memory module or flash memory device 104 and a memory controller 102. The flash memory module 104 may include multiple flash memory blocks 106, each of which includes multiple flash memory rows/pages (not shown). In some embodiments, each of the multiple flash memory rows/pages may have a plurality of cells. Additionally or alternatively, the module 104 can comprise or be implemented using a plurality of dies, each of the dies containing a plurality of the blocks 106.

The memory controller 102 may include a read circuit 110, a programming circuit (e.g. a program DSP) 120 and a programming parameter adapter 130. As shown in FIG. 1, the adapter 130 can adapt the programming parameters 122 used by programming circuit 120 as described above. The adapter 130 in this example may include a Program/Erase (P/E) cycle counter 132. Although shown separately for ease of illustration, some or all of the adapter 130 can be incorporated in the programming circuit 120. In some embodiments, the read circuit 110 may include an ICI estimator 111, an ECC decoder 112 and/or a soft information generator 113. In some embodiments, the programming circuit 120 may include an ECC encoder 124. Embodiments of memory controller 102 can include additional or fewer components such as those shown in FIG. 1.

In some embodiments, a flash memory system (e.g., the flash memory system 100 in FIG. 1) may include a cell flash memory (e.g., the flash memory module 104 or a flash memory block 106 in FIG. 1) and a circuit (e.g., the read circuit 110 or the programming circuit 120 in FIG. 1) for performing operations of the plurality of cells. In some embodiments, the flash memory module 104 may have a plurality of cells. In some embodiments, each of the flash memory blocks 106 may have a plurality of cells. In some embodiments, the ICI estimator 111 of the read circuit 110 may be configured to estimate an interference state based on a result of a read operation on a first neighboring cell of a first cell (i.e., a target cell) among the plurality of cells. Embodiments of estimating an interference state will be described below with reference to FIG. 2. In some embodiments, the soft information generator 113 of the read circuit 110 may be configured to generate soft information based on the estimated interference state and a read value from the first cell. Embodiments of generating soft information will be described below with reference to FIG. 3, FIG. 6 and FIG. 7. The read circuit 110 may be configured to perform a read operation on the first cell and decode, via the ECC decoder 112, a result of the read operation on the first cell based on the soft information. Embodiments of decoding a result of the read operation will be described below with reference to FIG. 8 to FIG. 11.

In some embodiments, the cell flash memory (e.g., the flash memory module 104 or a flash memory block 106 in FIG. 1) may include rows and columns of the plurality of cells. In some embodiments, a flash memory block 106 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 2:
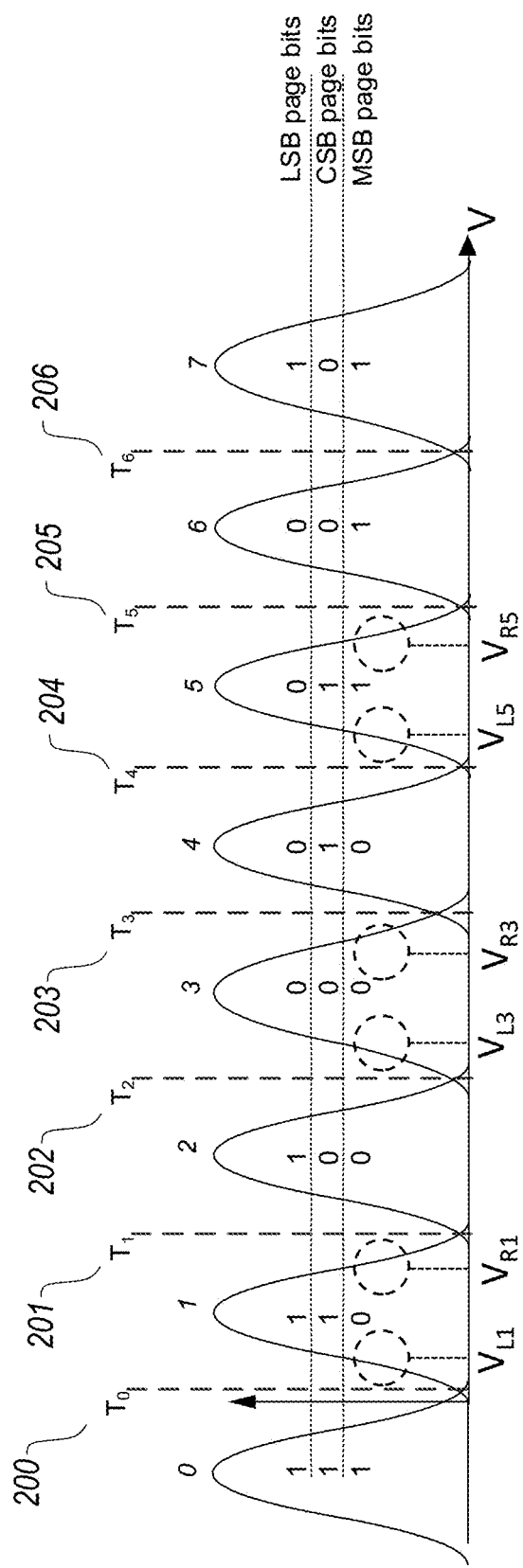
FIG. 2 illustrates threshold voltage distribution in a conventional three bits per cell (bpc) flash device.

Now, embodiments of estimating an interference state will be described with reference to FIG. 2. FIG. 2 illustrates a superposition of the 8 possible voltage threshold distributions of a three bits per cell (bpc) flash memory device. The possible voltage threshold (VT) distributions of the cell have eight lobes, corresponding to the 8 different bit combinations of the three bits represented by the charge state of the cell.

An MSB page read requires using thresholds $T_0$ (200 in FIG. 2), $T_4$ (204 in FIG. 2), to separate the lobes into those with MSBs of 0 and those with MSBs of 1. For reading CSB pages the read thresholds $T_1$ (201 in FIG. 2), $T_3$ (203 in FIG. 2) and $T_5$ (205 in FIG. 2) are used. For reading LSB pages the read thresholds $T_2$ and T6 (206 in FIG. 2) have to be used. The lower (left) most distribution is known as the erase level.

Inherent coupling noise between NAND memory cells can be generated from planar or three-dimensional (3D) NAND devices. In planar NAND devices, (1) neighboring cells on the same row and (2) neighboring cells on the same column of adjacent row may be dominant contributors to inter-cell interference (ICI). Thus, reliability gains for hard/soft input can be obtained by estimating the states of neighboring cells. In 3D triple-level cell (TLC) NAND devices, ICI coupling may be found on adjacent word-lines.

The main source of interference may be a programming scheme. For example, during a TLC programming, programming of one row may impact a near-by or adjacent row which is already programmed. The cells which are programmed to highest levels may be the source of a stronger interference (than those programmed to levels lower than the highest levels) which may cause unintentional programming of adjacent cells.

In some embodiments, a statistical dependency modelling of main interference sources and their impact can be characterized. For example, the ICI estimator 111 (see FIG. 1) may be configured to perform a statistical dependency modelling of interference sources and their impact. In some embodiments, a statistical dependency modelling of main interference sources and their impact can be characterized offline in a case where it is difficult to perform such statistical dependency modelling online because of different programming schemes of different NAND devices. For example, the programming scheme of one generation of NAND devices may be different from that of another generation of NAND devices. In some embodiments, the ICI estimator 111 (see FIG. 1) may perform a statistical dependency modelling of interference sources and their impact offline. In some embodiments, to perform such statistical dependency modelling offline for a target NAND device, the ICI estimator 111 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), information on the programming scheme of the target NAND device so that it can accurately model the interference sources and their impact in the target NAND device.

Figure 3:
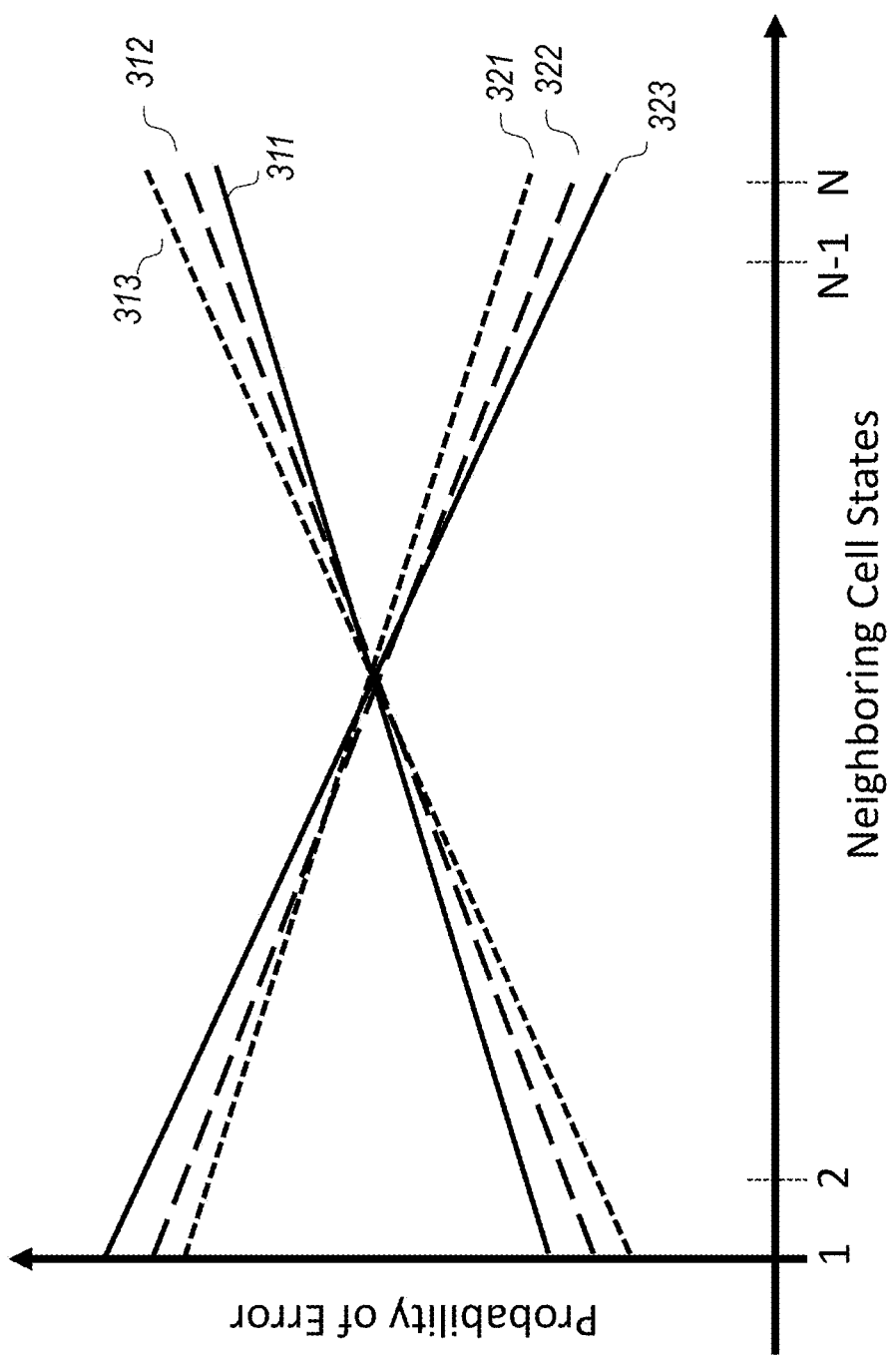
FIG. 3 is a diagram illustrating an example aspect of computing an error probability given states of neighboring cells in a flash memory device using example methodologies according to some embodiments.

In some embodiments, once interference sources and their impact are modeled or identified, simple signal processing operations can be performed to compensate for or decouple the interference. For example, sampling results of a target page can be post-processed to compensate for or decouple the interference. In some embodiments, reliability information for reading or decoding of a target page can be provided. For example, the soft information generator 113 of the read circuit 110 (see FIG. 1) may be configured to generate reliability information (e.g., calculating a probability of error as shown in FIG. 3) and provide soft information (e.g., labels 601, 602 shown in FIG. 6) based on the reliability information. Embodiments of generating soft information will be described in more detail below with reference to FIG. 6 and FIG. 7.

In some embodiments, the circuit (e.g., the ICI estimator 111 of the read circuit 110 in FIG. 1) may be configured to estimate an interference state based on a result of a read operation on a first neighboring cell of a first cell (i.e., a target cell) among the plurality of cells. More particularly, in some embodiments, in estimating the interference state, the circuit may be further configured to estimate a level at which the first neighboring cell is programmed. For example, the ICI estimator 111 may estimate, based on a result of a read operation on the first neighboring cell, a level at which the first neighboring cell is programmed. The ICI estimator 111 may then estimate an interference state of the first neighboring cell based on the estimated programmed level of the first neighboring cell. In some embodiments, the interference state of a neighboring cell is an estimated programmed level of the neighboring cell.

In estimating the interference state, the circuit (e.g., the ICI estimator 111) may be further configured to obtain the result of the read operation on the first neighboring cell from pre-fetch of a next page read or by saving a previous read result. For example, in estimating the interference state for a target cell in a target page, the ICI estimator 111 may obtain a read result of a neighboring cell (of the target cell) in a next page that is to be read next to the target page, by pre-fetching the read result of the next page. In some embodiments, the ICI estimator 111 may obtain a read result of a neighboring cell (of the target cell) in a previous page that has been read prior to the target page, by saving and reusing the read result of the previous page. In this manner, in some embodiments, the circuit may be configured to estimate interference states for decoding results of read operations on the plurality of cells by reading the rows of the plurality of cells sequentially and only once. For example, when rows #1, #2 and #3 are sequentially read, for estimating an interference state for a target cell in the row #1, a read result of the row #2 can be pre-fetched, and for estimating an interference state for a target cell in the row #2, a read result of the row #3 can be pre-fetched and a read result of the row #1 which was saved in memory can be reused, thereby allowing the rows #1, #2, #3 to be read sequentially and only once.

In some embodiments, the interfere state for a target cell may be analyzed and modeled as function of one or more cells adjacent to the target cell. In some embodiments, to analyze the contribution of interference of each neighboring cell, a single neighboring row state estimation may be performed without need of decoding. For example, the ICI estimator 111 (see FIG. 1) can estimate the interference state of a neighboring row from a hard read before decoding. In some embodiments, the ICI estimator 111 can estimate the interference state of a neighboring row post decoding as true data.

In some embodiments, the ICI estimator 111 may estimate the inference state of a neighboring cell from a distribution of state (or level) programmed in the neighboring cell. For example, with randomly programmed data to a NAND cell that can be programmed up to N levels (N=8 for TLC), the distribution of state in a neighboring cell, e.g., a neighboring cell in the next row, may be uniform. That is, the probability density of the estimated state x of the neighboring cell may be given by $$pdf(x) = \begin{cases} \frac{1}{N} & 1 \le x \le N \\ 0 & \text{else} \end{cases} \quad \text{(Equation 1)}$$

In some embodiments, in estimating an interference state for a first cell (i.e., the target cell), the circuit (e.g., the ICI estimator 111 in FIG. 1) may be configured to estimate, based on a result of read operations on first and second neighboring cells of the first cell, a combined programmed level of the first neighboring cell and the second neighboring cell. In some embodiments, the interference state of two neighboring cells can be estimated from a hard read (from the two neighboring cells) before decoding. In some embodiments, the interference state of two neighboring cells can be estimated post decoding as true data.

In some embodiments, the circuit may be configured to calculate a sum of states of neighboring rows of a target row, e.g., two adjacent rows before and after target row. In some embodiments, the circuit may be configured to calculate a sum of states of neighboring cells (of a target cell) in the same row as the row of the target cell. Calculation of the sum of states (e.g., programming levels) of neighboring rows or neighboring cells can capture the natural impact of interference which is unintentional programming with respect to a level of the target row or cell. The higher the programming levels of neighboring rows or cells are, the stronger the unintentional programming effect on the target row or cell is. In cases that there are two sources of interference with a target (e.g., a target cell or row), due to programming order or lack of isolation for two neighbors (e.g., two neighboring cells or rows), the sum of states of the two neighbors may be a good indication of the amount of additional programming (or interference) to a target cell.

In some embodiments, in estimating the interference state of a first neighboring cell and a second neighboring cell (of the target cell), the circuit (e.g., the ICI estimator 111 in FIG. 1) may be configured to calculate a probability density of a sum of two uniform random variables indicating programmed levels of the first neighboring cell and the second neighboring cell, respectively. For example, with randomly programmed data to a NAND cell that can be programmed up to N levels (N=8 for TLC), the distribution of sum-of-states x of two neighboring cells, e.g., two neighboring cells in the next row, may be estimated by calculating the probability density of sum-of-states x. In some embodiments, the probability density of sum-of-states x of two neighboring cells may be given by the following general pdf of a partial sum of two uniform random variables (RVs) each with N states:

$$pdf(x) = \begin{cases} \frac{(x-1)}{N^2} & 2 \le x \le N+1 \\ \frac{(2N+1-x)}{N^2} & N+1 < x \le 2N \\ 0 & \text{else} \end{cases} \quad \text{(Equation 2)}$$

In some embodiments, after estimating the interference state of a neighbor or neighbors of a target (e.g., cell or row), an error probability of the target over, or as a function of, the estimated interference state may be computed based on an empirical distribution by offline characterization of a NAND family of devices. In some embodiments, the error probability of the target as a function of the estimated interference state may be a per-bit error probability as a function of the estimated interference state. In some embodiments, the full statistical characteristics of conditional error probabilities may be computed from a large collection of voltage threshold (VT) distributions of many devices (e.g., the VT distributions of a three bpc flash memory device as shown in FIG. 2) and on different stress conditions. In some embodiments, a single set of empirical distribution can be computed or characterized offline and later adjusted compensated for under all stress conditions (e.g., when the coupling noise is added during programming). In some embodiments, calculation of such conditional error probabilities based on empirical distributions can be performed by the ICI estimator 111 of the read circuit 110 (see FIG. 1).

FIG. 3 is a diagram illustrating an example aspect of computing conditional error probability given states of neighboring cells in a flash memory device using example methodologies according to some embodiments. Assuming, for example, the next row (e.g., a row to be read next to the target row) as a dominant interference contributor, the x-axis in FIG. 3 is the states of neighboring cells of a target cell in the next row, which is 1, . . . , N where N is the number of levels that can be programmed to a cell, for example, N=8 for a TLC device. The y-axis is the probability of unidirectional error for a given threshold voltage of the target cell (e.g., threshold voltages $V_{L1}$, $V_{R1}$, $V_{L3}$, $V_{R3}$, $V_{L5}$, or $V_{R5}$ in FIG. 2).

In FIG. 3, lines 311, 312, 313 represent the probability of unidirectional errors over neighboring cell states for threshold voltages in right tail lobes, $V_{R1}$, $V_{R3}$, and $V_{R5}$ (see FIG. 2), respectively. These right lobe tail errors (as represented by the lines 311, 312, 313), as side information of interfering cells or cell interference side information, are unidirectional errors of over-programming, i.e., a cell programmed to state (or level) j is decoded as state (or level) j+1. From FIG. 3, it is observed that there is higher probability of error for on the right lobe tails (see the lines 311, 312, 313), when the neighboring cell is programmed to a higher level, while having a lowest probability of error in case the neighboring cells are on erase, i.e., programmed to the lowest level (state "1" in FIG. 3). Based on the observation, in some embodiments, the circuit (e.g., the soft information generator 113 in FIG. 1) may map, for a first interference state (e.g., state "N" in FIG. 3) indicating a higher programmed level of a neighboring cell than a second interference state (e.g., state "N−1" in FIG. 3), a right lobe tail of a threshold voltage distribution of a target cell to a first decoding error that is higher than a second decoding error mapped from the right lobe tail for the second interference state (e.g., state "N−1" in FIG. 3).

On the other hand, lines 321, 322, 323 represent the probability of unidirectional errors over neighboring cell states for threshold voltages in left tail lobes, $V_{L1}$, $V_{L3}$, and $V_{L5}$ (see FIG. 2), respectively. These left lobe tail errors (as represented by the lines 321, 322, 323), as side information of interfering cells or cell interference side information, are unidirectional errors of under-programming, i.e., a cell programmed to state (or level) j is decoded as state (or level) j−1. From FIG. 3, it is observed that there is lower probability of error for on the left lobe tails (see the lines 321, 322, 323), when the neighboring cell is programmed to a higher level, while having a highest probability of error in case the neighboring cells are on erase, i.e., programmed to the lowest level (state "1" in FIG. 3). Based on the observation, in some embodiments, the circuit (e.g., the soft information generator 113 in FIG. 1) may map, for a third interference state (e.g., state "2" in FIG. 3) indicating a higher programmed level of the first neighboring cell than a fourth interference state (e.g., state "1" in FIG. 3), a left lobe tail of the threshold voltage distribution of the target cell to a third decoding error that is lower than a fourth decoding error mapped from the left lobe tail for the fourth interference state (e.g., state "1" in FIG. 3).

In some embodiments, the circuit (e.g., the soft information generator 113) may compute the probability of error for right and left lobe tails as function of state of a dominant interference cell, or as function of a combination of states of interference cells, such as sum of states. In some embodiments, the circuit may compute the probability of error for a hard read from the target cell, given the interference state, as function of state of a dominant interference cell, or as function of a combination of states of interference cells, such as sum of states. In some embodiments, after computing the probability of error for a hard read given the interference state, a memory controller (e.g., the memory controller 102 in FIG. 1) may perform, within a controller read-flow, hard reads which are accompanied by hard reads of interference, and use results of the hard reads to compute soft information as a decoder input. In some embodiments, using soft-information, the decoder (e.g., the ECC decoder 112 in FIG. 1) can correct more errors, thereby achieving higher endurance and higher stress resilience of a NAND controller.

In some embodiments, the circuit (e.g., the soft information generator 113 of the read circuit 110) may be configured to generate soft information based on a read value from the first cell (i.e., the target cell) and the estimated interference state (e.g., the estimated interference state of neighboring cell(s)). In some embodiments, in generating the soft information, the circuit (e.g., the soft information generator 113) may compute an error probability of decoding the result of the read operation on the first cell over (as a function of) the estimated interference state (e.g., the probability of error over, or as a function of, the neighboring cell states as shown in FIG. 3). In some embodiments, the soft information may indicate decoding errors due to the interference state. In some embodiments, the soft information may be labels or assignments of LLR values to threshold voltages (e.g., the labels 601, 602 in FIG. 6).

Figure 4:
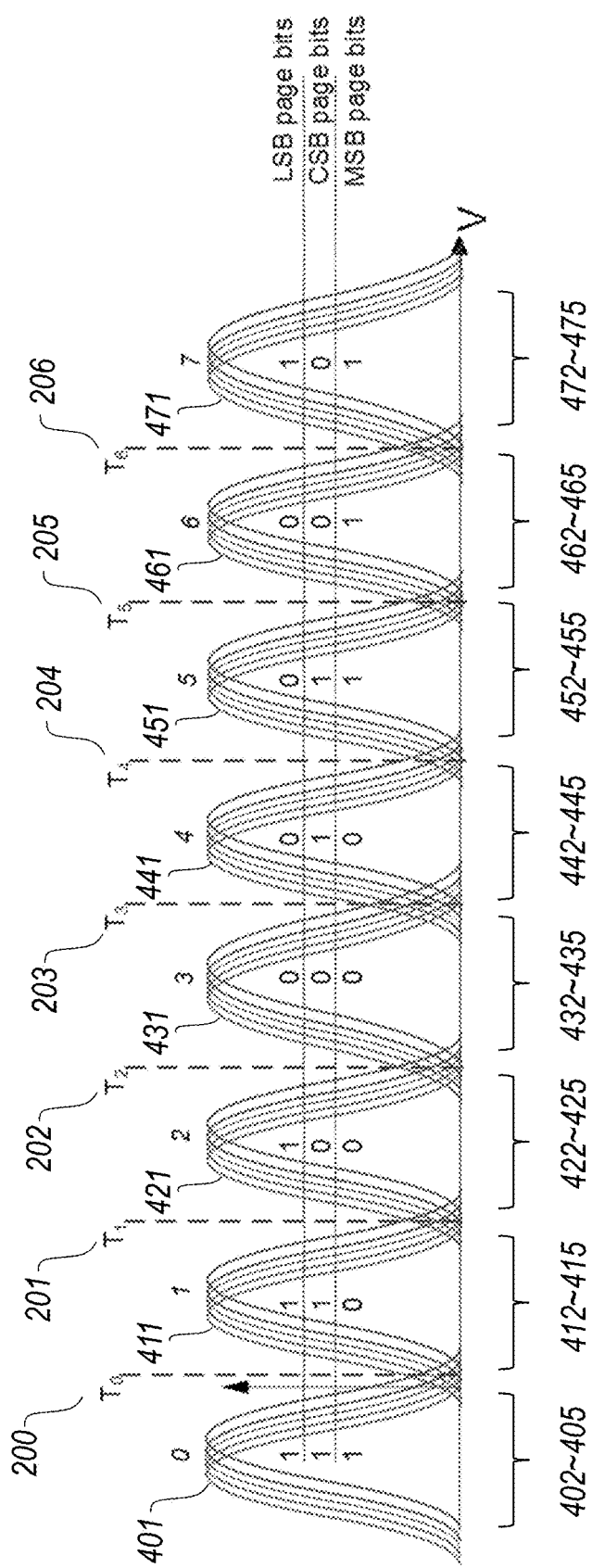
FIG. 4 is a diagram illustrating an example aspect of computing threshold voltage distribution given four states of neighboring cells in a flash memory device using example methodologies according to some embodiments.

FIG. 4 is a diagram illustrating an example aspect of computing threshold voltage distribution given four states of neighboring cells in a flash memory device using example methodologies according to some embodiments. FIG. 4 illustrates a superposition of 8 possible voltage threshold (VT) distributions of a three bits per cell (bpc) flash memory device without ICI (i.e., the "original" VT distributions 401, 411, 421, 431, 441, 451, 461, 471). FIG. 4 also illustrates, for each original VT distributions, conditional VT distributions given each of four interference states. For example, for the original VT distribution 401, four conditional VT distributions 402-405 given four interference states, respectively. Similarly, FIG. 4 shows four conditional VT distributions 412-415 (for the original VT distribution 411), four conditional VT distributions 422-415 (for the original VT distribution 421), four conditional VT distributions 432-435 (for the original VT distribution 431), four conditional VT distributions 442-445 (for the original VT distribution 441), four conditional VT distributions 452-455 (for the original VT distribution 451), four conditional VT distributions 462-465 (for the original VT distribution 461), and four conditional VT distributions 472-475 (for the original VT distribution 471). In other words, FIG. 4 illustrates an example of the impact of interference on the VT distribution, by considering a 4-level interference model, where the dominant interference source has four main states, i.e., M=4. It is observed from FIG. 4 that the interference impact is a shift relative to the original programmed state.

In some embodiments, soft sampling of a target page may be post-processed by using side information (see FIG. 3) of interference state estimation $\hat{i}_n$, and decoder input will be $$z_n = y_n - \hat{i}_n \qquad \text{(Equation 3)}$$

where $z_n$ is a VT level after ICI decoupling, and its sampled version around a decision threshold may be used as input to a decoder (e.g., the ECC decoder 112 in FIG. 1). In some embodiments, sampling may be conducted to achieve efficient hard decoding with reduced BER. In some embodiments, sampling may be used for providing soft input to the decoder with reduced interference.

In some embodiments, if a single neighboring row (e.g., a next row) is the main interference contributor, it may be possible to estimate the interference level (or state) $\hat{i}_n$ with a single level read, which corresponds to reading the next row with a single threshold corresponding to M=2 possible states. For example, the interference estimation state may be $\hat{i}_n \in \{0, 1\}$ and each estimated interference level can translate to a VT shift that has to be applied to a threshold voltage for ICI coupling.

Figure 5:
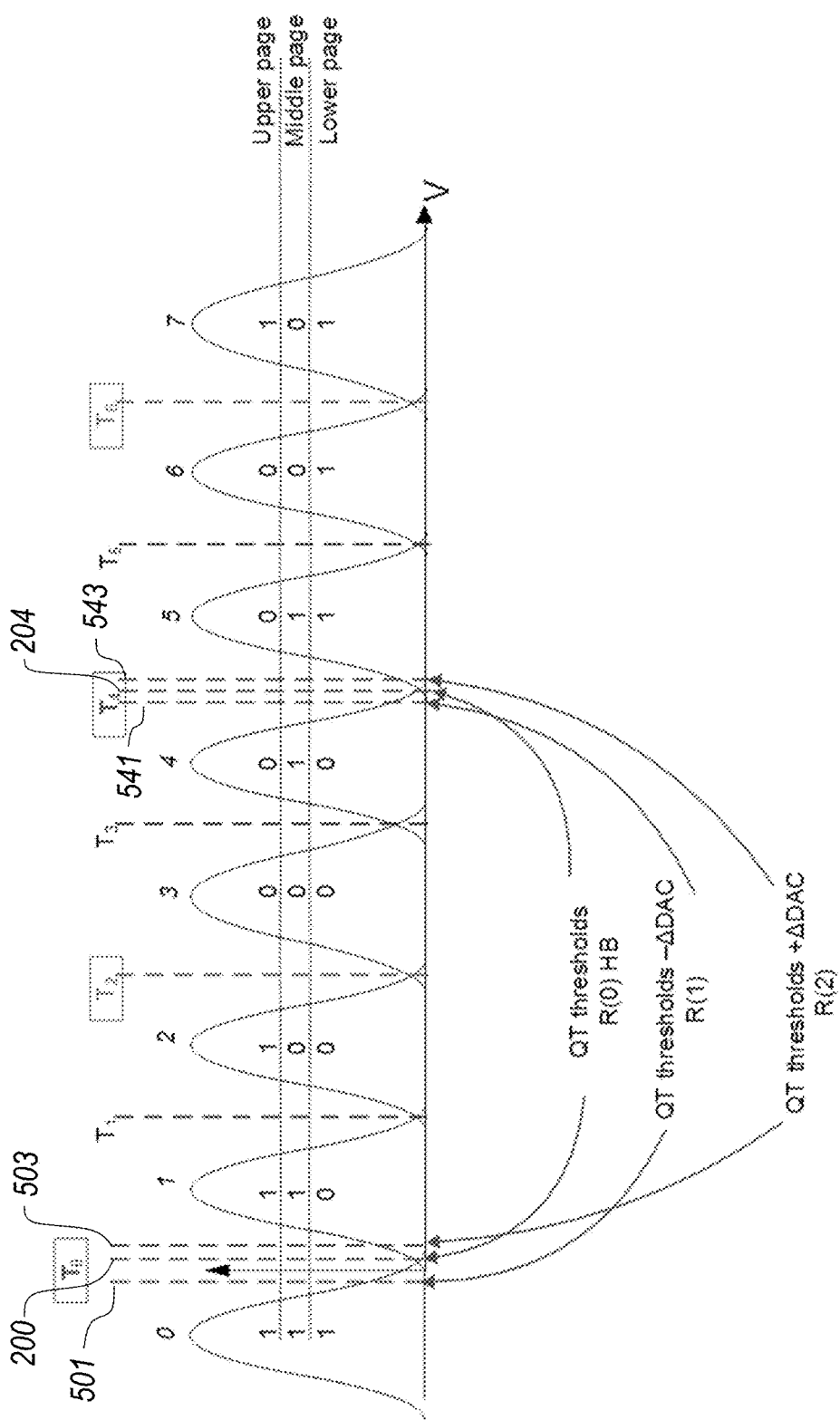
FIG. 5 is a diagram illustrating an example aspect of an inter-cell interference (ICI) decoupling given two interference states of neighboring cells in a flash memory device using example methodologies according to some embodiments.

FIG. 5 is a diagram illustrating an example aspect of an inter-cell interference (ICI) decoupling given two interference states of neighboring cells in a flash memory device using example methodologies according to some embodiments. More particularly, FIG. 5 illustrates an example method of reducing ICI with two interference states for generating hard input with reduced BER.

In some embodiments, a simple read flow can be performed to maximize a read flow throughput and provide hard input to a decoder when needed. In some embodiments, upon receipt of a read command, an attempt to perform a hard read with estimated optimal thresholds may be made. For example, as shown in FIG. 5, an attempt to read a lower page may be made with threshold voltages $T_0$, $T_4$. In some embodiments, a result of the hard bit read using the threshold voltages, i.e., a hard bit (HB) thresholds read, may be stored into data buffer R(0) and an attempt to decode the result may be made. If the (hard) decoding fails, the controller (e.g., the memory controller 102 in FIG. 1) may read an interference generating row (i.e., a row that generates ICI with the target cell or page) with a single threshold, and obtain $\hat{i}_n \in \{0, 1\}$. In some embodiments, in obtaining $\hat{i}_n \in \{0, 1\}$, probability density of an estimated state x of a neighboring cell (or neighboring cells) as shown Equation (1) or Equation (2) may be utilized. In some embodiments, in obtaining $\hat{i}_n \in \{0, 1\}$, cell interference side information as shown in FIG. 3 may be utilized.

In some embodiments, in addition to the result stored in the data buffer R(0), two reads of target page may be performed and results thereof may be stored into data buffer R(1) and data buffer R(2). In some embodiments, the two reads of the target page may be performed with shifted HB voltage thresholds that are shifted with shifted values of a fixed step size (for example, measured in digital-to-analog converter (DAC) values) from the original HB voltage thresholds, such that interference compensation can be efficiently performed. For example, as shown in FIG. 5, with respect to the original HB voltage threshold $T_0$, two reads of the target page may be performed with shifted HB voltages e.g., the shifted HB voltages 501 and 503 which are quantized (QT) $(T_0) - \Delta DAC$ and $QT(T_0) + \Delta DAC$, respectively. Similarly, with respect to the original HB voltage threshold $T_4$, two reads of the target page may be performed with shifted HB voltages, e.g., the shifted HB voltages 541 and 543 which are $QT(T_4) - \Delta DAC$ and $QT(T_4) + \Delta DAC$, respectively.

In some embodiments, as a next step, a decoder input (e.g., a decoder hard input) may be computed by $$C_{in} = \hat{i}_n \cdot R(2) + (1 - \hat{i}_n) \cdot R(1) \qquad \text{(Equation 3)}$$

where $C_{in}$ is a reduced BER hard input to the decoder. In some embodiments, both R(1) and R(2) may be results of shifted reads in two different or opposite directions relative to HB thresholds. For example, R(1) and R(2) may store results of shifted reads using the shifted threshold voltages $QT(T_0) + \Delta DAC$ and $QT(T_0) - \Delta DAC$. In some embodiments, the shift may be optimized such that interference impact on the target cell or page can be minimized after shift, given the interference state $\hat{i}_n \in \{0, 1\}$. In some embodiments, such optimization may be performed using an offline statistical modelling or characterization. For example, the amount of required shift can be computed using the conditional VT distributions as exemplified in FIG. 2 which can be obtained during the offline statistical modelling and characterization.

In some embodiments, a flash memory system (e.g., the flash system 100 in FIG. 1) may include a cell flash memory (e.g., the flash memory module 104 in FIG. 1) having a plurality of threshold voltages (e.g., $T_0, T_1, \ldots, T_6$ in FIG. 5) and a circuit (e.g., the read circuit 110 in FIG. 1) for performing operations of the cell flash memory. Referring to FIG. 5, the circuit may be configured to perform a first read operation on a first cell of the cell flash memory (i.e., the target cell or page) with a first threshold voltage (e.g., $T_0$ in FIG. 5) among the plurality of threshold voltages. In some embodiments, a result of the first read operation may be stored in a data buffer (e.g., R(0) in FIG. 5). The circuit may be configured to estimate a first interference state $\hat{i}_n \in \{0, 1\}$ relating to the first threshold voltage. The circuit may be configured to estimate a first voltage shift (e.g., $\Delta DAC$) based on the first interference state. The circuit may be configured to perform a first shifted read operation on the first cell of the cell flash memory with a shifted first threshold voltage shifted with the first voltage shift (e.g., $QT(T_0) + \Delta DAC$ or $QT(T_0) - \Delta DAC$). In some embodiments, a result of the first shifted read operation may be stored in a data buffer (e.g., R(1) or R(2) in FIG. 5). The circuit may be configured to generate a first decoder input (e.g., the decoder hard input $C_{in}$ as shown in Equation (3)) based on the estimated first interference state (e.g., in) and the result of the first shifted read operation on the first cell (e.g., R(1) or R(2)). The circuit may be configured to decode, based on the first decoder input $C_{in}$, a result of the first read operation on the first cell (e.g., R(0)).

In some embodiments, in estimating the first interference state (e.g., in), the circuit may be further configured to perform a single level read operation on a neighboring cell or row of the first cell (i.e., the target cell). The circuit may be configured to estimate the first interference state based on side information (see FIG. 3) of a programmed level of the neighboring cell relative to the first threshold voltage (e.g., $T_0$ in FIG. 5), so that the first interference state indicates whether the programmed level of the neighboring cell can cause a voltage shift relative to the first threshold voltage of the first cell.

In some embodiments, in estimating the first voltage shift (e.g., $\Delta DAC$), the circuit may be configured to perform an offline statistical modeling and characterization using a conditional voltage threshold distribution (e.g., the VT distributions as shown in FIG. 4). The circuit may be configured to estimate the first voltage shift based on a result of the offline statistical modeling and characterization.

In some embodiments, the circuit may be configured to perform a second read operation on the first cell of the cell flash memory (i.e., the target cell or page) with a second threshold voltage (e.g., $T_4$ in FIG. 5) among the plurality of threshold voltages (e.g., $T_0, T_1, \ldots, T_6$ in FIG. 5). In some embodiments, a result of the second read operation may be stored in a data buffer (e.g., R(0) in FIG. 5). The circuit may be configured to estimate a second interference state (e.g., $\hat{i}_n \in \{0, 1\}$) relating to the second threshold voltage. The circuit may be configured to estimate a second voltage shift (e.g., $\Delta DAC$) based on the second interference state. The circuit may be configured to perform a second shifted read operation on the first cell of the cell flash memory with a shifted second threshold voltage shifted with the second voltage shift (e.g., $QT(T_4)+\Delta DAC$ or $QT(T_4)-\Delta DAC$). In some embodiments, a result of the second shifted read operation may be stored in a data buffer (e.g., R(1) or R(2) in FIG. 5). The circuit may be configured to generate a second decoder input (e.g., the decoder hard input $C_{in}$ as shown in Equation (3)) based on the estimated second interference state in and the result of the second shifted read operation on the first cell (e.g., R(1) or R(2)). The circuit may be configured to decode, based on the second decoder input $C_{in}$, a result of the second read operation on the first cell (e.g., R(0)).

With the configurations illustrated in FIG. 5, for example, the raw BER of a target codeword can be reduced. For example, hard bit decoding can be performed at lower BER by utilizing interference side information.

Figure 6:
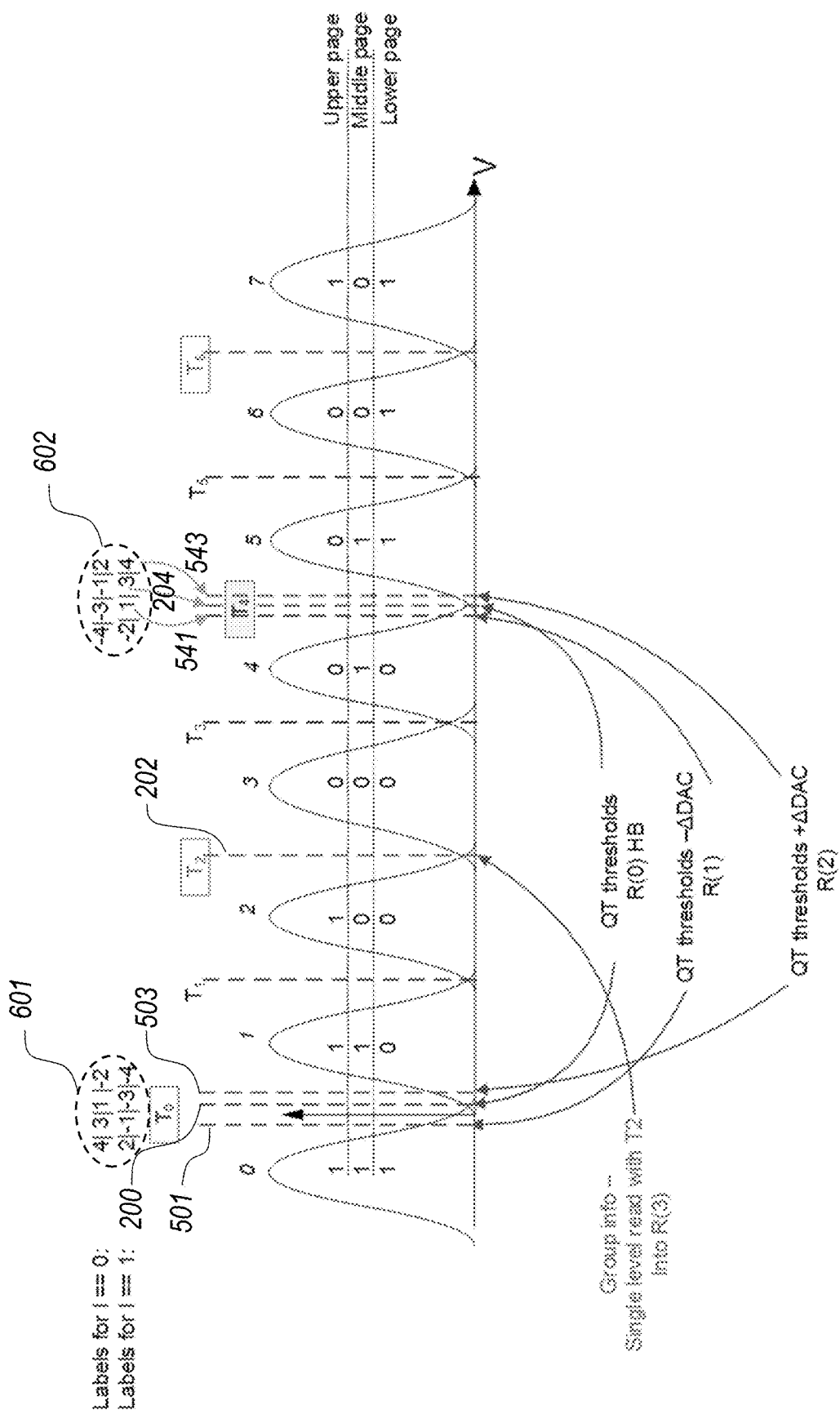
FIG. 6 is a diagram illustrating an example aspect of generating soft information with an ICI decoupling given two interference states of neighboring cells in a flash memory device using example methodologies according to some embodiments.

FIG. 6 is a diagram illustrating an example aspect of generating soft information with an ICI decoupling given two interference states of neighboring cells in a flash memory device using example methodologies according to some embodiments. More particularly, FIG. 6 illustrates soft sampling and assignment of soft information (i.e., labeling) while decoupling interference.

In some embodiments, in cases that the decoder fails to decode the decoder hard input $C_{in}$ (see FIG. 5), it is possible to use the existing data buffer samples and generate soft information as input to the decoder. In some embodiments, assignment of soft information (e.g., assignment of LLRs) may be performed.

In some embodiments, as shown in FIG. 6, soft information may be generated with only one additional read with the threshold voltage $T_2$, and a result G of the additional read may be stored in a data buffer R(3). For example, the labels 601 and 602 as soft information may be generated using R(0), R(1), R(2), R(3) and the interference estimation $\hat{i}_n$ (denoted by "I" in FIG. 6). In some embodiments, the labels may be directly mapped from a hard read value and an estimated interference state. For example, in the label 602, the hard read value R(0) and the estimated interference state may be mapped to −1 (when I=0) and 3 (when I=1); the hard read value R(1) and the estimated interference state may be mapped to −3 (when I=0) and 1 (when I=1); and the hard read value R(2) and the estimated interference state may be mapped to 2 (when I=0) and 4 (when I=1). In some embodiments, the signs of labels may represent hard decision values, and the absolute values of the labels may correspond to reliability.

In some embodiments, the soft information may be log-likelihood ratio (LLR) values which are mapped from a hard read value and one of state interference values (e.g., 0 and 1; see FIG. 6). In some embodiments, a state interference value among the set of (0 and 1) can be determined based on (1) an estimated state of neighboring cell(s) and (2) side information of interfering cells (or cell interference side information), e.g., whether the estimated state of neighboring cell(s) impacts a threshold voltage of the target cell in a right lobe tail or a left lobe tail. For example, a higher state of neighboring cell(s) (e.g., "N−1" in FIG. 3) may increase the probability of hard read errors on the right lobe tail voltages (e.g., voltages represented by the lines 311, 312, 313). Because such increased error probability in the right lobe tail voltages represent over-programming of a true level, a positive state interference value (e.g., 1 or 2) may be assigned to the state "N−1" and may be used to assign probability of over-programming. A lower state of neighboring cell(s) (e.g., "2" in FIG. 3) the over-programming probability on right tail is low, and also their probability of being in error state is low. Similarly, a lower state neighboring cell(s) may increase the read error probability in the left lobe tail voltages (e.g., voltages represented by the lines 321, 322, 323). Because such increased error probability in the left lobe tail voltages represent under-programming of a true level, the low state of a neighboring cell may correspond to high probability of read error (on left tail direction) for these cells.

More particularly, referring to FIG. 6, in some embodiments, in generating the soft information, the circuit (e.g., the soft information generator 113 in FIG. 1) may map a pair of (1) a hard bit read value (e.g., values in R(0), R(1), R(2) in FIG. 6) of a bit represented by the first cell (e.g., the target cell) as a result of read operation on the target cell and (2) an interference state of the first neighboring cell (e.g., I=0 or 1 in FIG. 6) to a log-likelihood ratio (LLR) value as the soft information (e.g., values in the labels 601 and 602 in FIG. 6).

In some embodiments, the LLR values in the labels in FIG. 6 may represent a certainty of a hard bit read value. In some embodiments, the conditional LLR value of hard bit read value b=0, which depends on the interference state I, can be defined by $$LLR1(b|I) = \log\left(\frac{P(b=1|I)}{P(b=0|I)}\right) \quad \text{(Equation 4)}$$

The conditional error probability LLR1(b|I) can be used to generate LLR values for hard bit read value "0" given the estimated interference state (e.g., "0", "1").

Similarly, the conditional LLR value of hard bit read value b=1, which depends on the interference state I, can be defined by $$LLR2(b|I) = \log\left(\frac{P(b=0|I)}{P(b=1|I)}\right) \quad \text{(Equation 5)}$$

The conditional error probability LLR2(b|I) can be used to generate LLR values for hard bit read value "1" given the estimated interference state (e.g., "0", "1").

In some embodiments, the probability P(b=0|I) or P(b=1|I) may be obtained by offline characterization of a NAND device, based on its programming scheme. In some embodiments, because interference characteristics is device-dependent characteristics, calculation of the probability P(b=0|I) or P(b=1|I) based on offline characterization of NAND devices may be performed once for a device family. In some embodiments, after calculating the initial probability P(b=0|I) or P(b=1|I), sampling the interference may be performed to update the probability P(b=0|I) or P(b=1|I) (for example, a coarse estimation without decoding is enough), and then the conditional probability of error LLR1(b|I) or LLR2(b|I) may be updated and assigned as soft information.

Referring to FIG. 6, in some embodiments, the sampling thresholds $T_0$, $T_4$ for R(0), R(1), R(2) may be optimized to jointly reduce the interference and maximize the mutual information available in the soft sampling under high stress conditions in terms of, for example, program-disturb (PD), read disturb (RD) or data retention (DR). With such optimizations, the associated codeword can be decoded at a high BER even under high stress conditions.

In some embodiments, for a lower page, for example, an additional read (e.g., a read with the threshold voltage $T_2$ in FIG. 6) may be performed to be able to separate between the two thresholds (e.g., $T_0$ and $T_4$ in FIG. 6). Referring to FIG. 6, in some embodiments, the circuit (e.g., the read circuit 110) may be configured to perform a third read operation on the first cell of the cell flash memory with a third threshold voltage (e.g., the threshold voltage $T_2$ in FIG. 6) among the plurality of threshold voltages. The third threshold voltage (e.g., $T_2$) may be a voltage between the first threshold voltage (e.g., $T_0$) and the second threshold voltage (e.g., $T_4$). With respect to the first threshold voltage (e.g., $T_0$), the circuit may be configured to generate first soft information (e.g., the label 601) by mapping a pair of (1) each of read values from the first read operation (e.g., R(0) in FIG. 6), the shifted first read operation (e.g., R(1), R(2) in FIG. 6), and the third read operation (e.g., R(3) in FIG. 6) and (2) the estimated first interference state to a log-likelihood ratio (LLR) as the first soft information (e.g., I=0 or 1). The circuit may be configured to decode, based on the first soft information (e.g., the label 601), the result of the first read operation on the first cell (e.g., R(0)). Similarly, with respect to the first threshold voltage (e.g., $T_4$), the circuit may be configured to generate second soft information (e.g., the label 602) by mapping a pair of (1) each of read values from the second read operation (e.g., R(0) in FIG. 6), the shifted second read operation (e.g., R(1), R(2) in FIG. 6), and the third read operation (e.g., R(3) in FIG. 6) and (2) the estimated second interference state (e.g., I=0 or 1) to an LLR as the second soft information. The circuit may be configured to decode, based on the second soft information (e.g., the label 602), the result of the second read operation on the first cell (e.g., R(0) in FIG. 6).

FIG. 6 illustrates a method for reducing interference for a lower page read; however, similar techniques can be applied to reduce interference for the middle/upper page reads. With the configuration illustrated in FIG. 6, efficient ICI decoupling can be performed by manipulation of soft information (e.g., the labels 601, 602).

Figure 7:
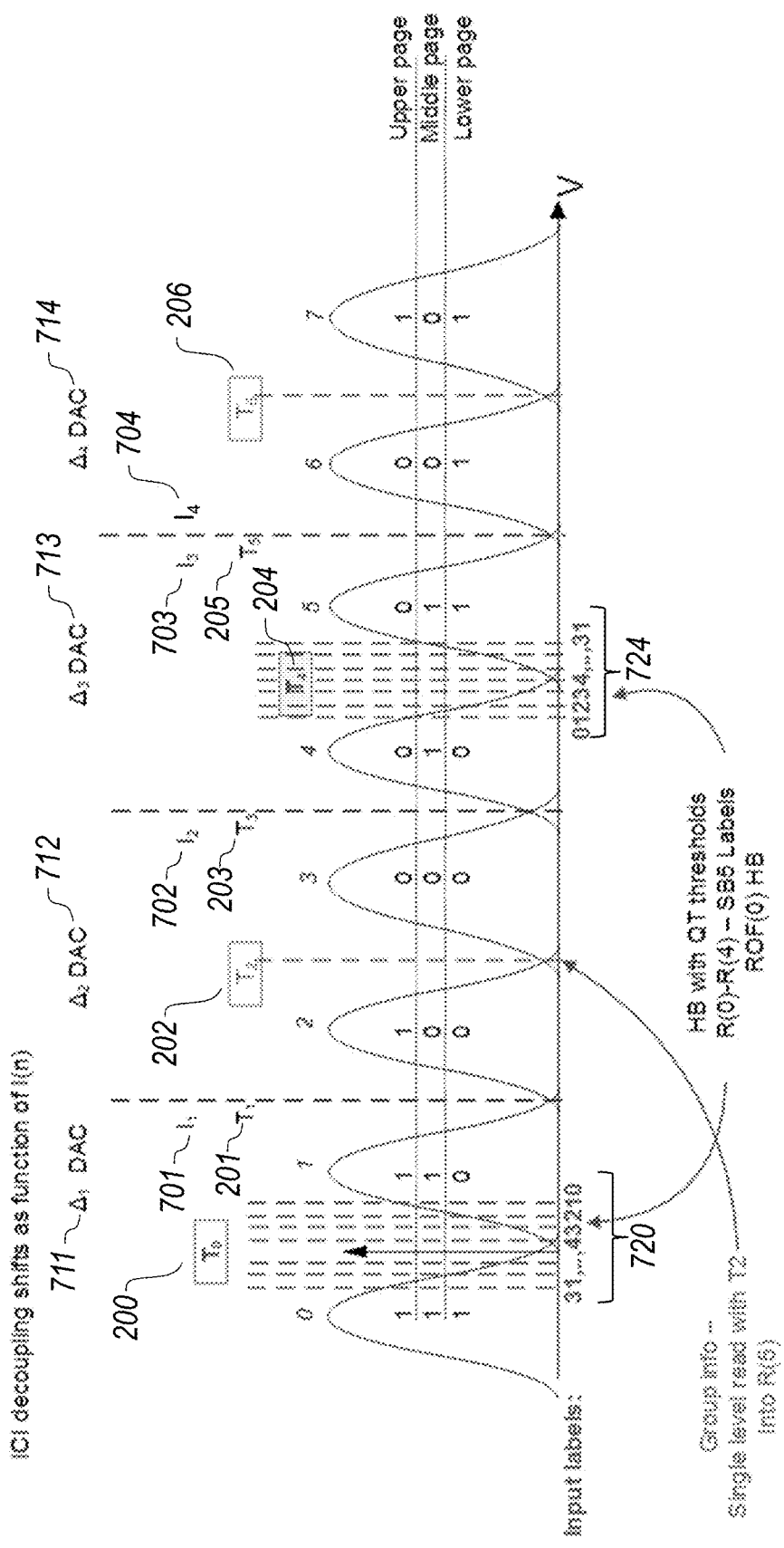
FIG. 7 is a diagram illustrating an example aspect of 5-bit soft sampling and an ICI decoupling given four interference states of neighboring cells in a flash memory device using example methodologies according to some embodiments.

FIG. 7 is a diagram illustrating an example aspect of 5-bit soft sampling and an ICI decoupling given four interference states of neighboring cells in a flash memory device using example methodologies according to some embodiments. More particularly, FIG. 7 illustrates an example of 5-bit sampling with side information of estimated four interference states.

In case the soft decoding as described in FIG. 6 fails to decode a page read, it is possible to improve the interference mitigation and soft decoding capability by enriching the soft resolution and the interference state resolution. In some embodiments, a 5-bit soft sampling can be used to compensate for a high resolution interference state information (e.g., interference state information of four interference states in FIG. 7) by performing multiple single level read operations on an interference dependent row (e.g., a next row adjacent to the target page), and performing incremental shifts for every state of the high resolution interference states.

Referring to FIG. 7, the 5-bit soft sampling may be performed by modifying thresholds $T_0$, $T_4$ 31 times to provide a 5-bit sampling resolution (32 soft samples in total) around the decision thresholds $T_0$, $T_4$. For example, as shown in FIG. 7, soft samples 720 and soft samples 724 may both have 5-bit resolution. In some embodiments, the soft samples may be stored in R(0)~R(4) as an input label $L_{in}$.

$$L_{in}=R(0)\sim R(4) \quad \text{(Equation 6)}$$

In some embodiments, as shown in FIG. 7, a read with the threshold voltage T2 may be performed, and a result G of the additional read may be stored in a data buffer R(5). In some embodiments, if the soft decoding as described in FIG. 6 has been already performed, the result G (as thresholds group information) may be available and an additional read needs not be performed.

In some embodiments, as shown in FIG. 7, four interference states $I_1$ (701), $I_2$ (702), $I_3$ (703), and $I_4$ (704) around threshold voltages $T_1$ (201), $T_3$ (203), $T_5$ (205) may be estimated by performing single level reads of a dependent row (i.e., interfering row) with threshold voltages $T_1$, $T_3$, $T_5$. For every interference state, there may be a corresponding shift (or interference mitigation value) to be used in calculating soft information (e.g., labels $L_1$, $L_2$, $L_3$ as shown below). Referring to FIG. 7, $\Delta_i$ denotes a shift that has to be applied on the labels for the i-th interference state. For example, as shown in FIG. 7, the shift $\Delta_1$ (711) corresponds to $I_1$; the shift $\Delta_2$ (712) corresponds to $I_2$; the shift $\Delta_3$ (713) corresponds to $I_3$; and the shift $\Delta_4$ (714) corresponds to $I_4$.

In some embodiments, the labels $L_1$, $L_2$, $L_3$ as soft information may be generated as follows. In some embodiments, after performing a single read with the voltage threshold $T_1$, the interference state I and corresponding shift $\Delta_1$ may be calculated. Then, the label $L_1$ may be calculated by $$L_1=\min\{31,\max\{0,L_{in}+I_1\cdot(2G-1)\cdot\Delta_1\}\} \quad \text{(Equation 7)}$$

After performing a single read with the voltage threshold $T_3$, the interference state $I_2$ and corresponding shift $\Delta_2$ may be calculated, and the label $L_2$ may be calculated by $$L_2=\min\{31,\max\{0,L_1+I_2\cdot(2G-1)\cdot\Delta_2\}\} \quad \text{(Equation 8)}$$

After performing a single read with the voltage threshold $T_5$, the interference states $I_3$ and $I_4$ and corresponding shifts $\Delta_3$ and $\Delta_4$ may be calculated, and the label $L_3$ may be calculated by $$L_3=\min\{31,\max\{0,L_2+(2G-1)\cdot(\Delta_3+(1-I_3)\cdot\Delta_4)\}\} \quad \text{(Equation 9)}$$

In some embodiments, a value of $L_3$ may be mapped into an LLR value. In some embodiments, without loss of generality, the shift $\Delta_i$ for every i=1, ..., 4 may be a differential value. For example, the labels may be shifted by $\Delta_1$ and then shifted by $\Delta_2$, and so on. In some embodiments, the shift $\Delta_3$ can be set to $\Delta_3=0$ without loss in optimality.

Referring to FIG. 7, in some embodiments, a flash memory system (e.g., the flash system 100 in FIG. 1) may include a cell flash memory (e.g., the flash memory module 104 in FIG. 1) having a plurality of threshold voltages (e.g., $T_0$, $T_1$, ..., $T_6$ in FIG. 7), and a circuit (e.g., the read circuit 110 in FIG. 1) for performing operations of the cell flash memory. The circuit may be configured to perform a first read operation on a first cell of the cell flash memory (i.e., the target cell or page) with a first threshold voltage (e.g., $T_0$) among the plurality of threshold voltages. The circuit may be configured to generate a first plurality of threshold voltage samples (e.g., the soft samples 720 in FIG. 7) corresponding to the first threshold voltage. The circuit may be configured to estimate a first interference state (e.g., $I_1$), a second interference state (e.g., $I_2$), a third interference state (e.g., $I_3$), and a fourth interference state (e.g., $I_4$) which relate to three threshold voltages (e.g., $T_1$, $T_3$, $T_5$ in FIG. 7) other than the first threshold voltage among the plurality of threshold voltages. The circuit may be configured to perform a second read operation on the first cell of the cell flash memory with a second threshold voltage (e.g., $T_2$) among the plurality of threshold voltages. For each of the first plurality of threshold voltage samples (e.g., the soft samples 720 in FIG. 7), the circuit may be configured to generate first soft information (e.g., the label $L_1$) based on a result of the second read operation (e.g., G stored in R(5)) and the first estimated interference state (e.g., $I_1$), generate second soft information (e.g., the label $L_2$) based on the first soft information (e.g., the label $L_1$), the result of the second read operation (e.g., G stored in R(5)), and the second estimated interference state (e.g., $I_2$), and generate third soft information (e.g., the label $L_3$) based on the second soft information (e.g., the label $L_2$), the result of the second read operation (e.g., G stored in R(5)), the third estimated interference state (e.g., $I_3$) and the fourth estimated interference state (e.g., $I_4$). See Equations 7-9. The circuit may be configured to decode, based on the third soft information (e.g., the label $L_3$), a result of the first read operation on the first cell.

In some embodiments, a first one (e.g., $T_1$) of the three threshold voltages (e.g., $T_1$, $T_3$, $T_5$ in FIG. 7) may be lower than a second one (e.g., $T_3$) of the three threshold voltages which is lower than a third one (e.g., $T_5$) of the three threshold voltages. In estimating the first, second, third and fourth interference states (e.g., $I_1$~$I_4$), the circuit may be configured to perform a single level read operation on a first neighboring cell of the first cell with each of the first one (e.g., $T_1$), second one (e.g., $T_3$) and third one (e.g., $T_5$) of the three threshold voltages. The circuit may be configured to estimate the first, second and third interference states (e.g., $I_1$~$I_3$) based on side information of a programmed level of the first neighboring cell relative to the first one (e.g., $T_1$), second one (e.g., $T_3$) and third one (e.g., $T_5$) of the three threshold voltages, respectively, so that the first, second and third interference states indicate whether the programmed level of the first neighboring cell can cause a voltage shift relative to the first one, second one and third one of the three threshold voltages of the first cell, respectively. The circuit may be configured to estimate the fourth interference state (e.g., $I_4$) based on side information of a programmed level of the first neighboring cell relative to the third one (e.g., $T_5$) of the three threshold voltages, so that the fourth interference state indicates whether the programmed level of the first neighboring cell can cause a voltage shift relative to the third one (e.g., $T_5$) of the three threshold voltages of the first cell.

In some embodiments, in generating the first plurality of threshold voltage samples (e.g., the soft samples 720 in FIG. 7), the circuit may be configured to perform a first number of bits soft decoding (e.g., soft decoding similar to the method illustrated in FIG. 7 but utilizing 2-bit soft samples) of the result of the first read operation on the first cell. The circuit may be configured to determine whether the first number of bits soft decoding succeeds. The circuit may be configured to generate, responsive to determination that the first number of bits soft decoding does not succeed, the first plurality of threshold voltage samples (e.g., the soft samples 720 in FIG. 7) whose number is represented with a second number of bits (e.g., the soft samples 720 is represented with 5 bits), wherein the second number is greater than the first number (5-bit is greater than 2-bit).

In some embodiments, in generating the first soft information (e.g., the label $L_1$), the circuit may be configured to estimate, based on the first estimated interference state (e.g., $I_1$), a first voltage shift (e.g., the shift $\Delta_1$ in FIG. 7) representing a voltage value mitigating an interference corresponding to the first estimated interference state. The circuit may be configured to add an amount of the first voltage shift (e.g., $I_1 \cdot (2G-1) \cdot \Delta_1$) to a quantized value of each of the first plurality of threshold voltage samples (e.g., $L_0$=R(0)~R(4)). See Equation 7.

In some embodiments, in generating the second soft information (e.g., the label $L_2$), the circuit may be configured to estimate, based on the second estimated interference state (e.g., $I_2$), a second voltage shift (e.g., the shift $\Delta_2$ in FIG. 7) representing a voltage value mitigating an interference corresponding to the second estimated interference state. The circuit may be configured to add an amount of the second voltage shift (e.g., $(2G-1) \cdot \Delta_2$) to a quantized value of the first soft information (e.g., the label $L_1$). See Equation 8.

In some embodiments, in generating the third soft information (e.g., the label $L_3$), the circuit may be configured to estimate, based on the third and fourth estimated interference states (e.g., $I_3$ and $I_4$), a third voltage shift and a fourth voltage shift (e.g., the shifts $\Delta_3$ and $\Delta_4$ in FIG. 7) respectively representing a voltage value mitigating an interference corresponding to the third and fourth estimated interference states. The circuit may be configured to add an amount of the third voltage shift and an amount of the fourth voltage shift (e.g., $(2G-1) \cdot (\Delta_3+(1-I_3) \cdot \Delta_4)$) to a quantized value of the second soft information (e.g., the label $L_2$). See Equation 9. In some embodiments, the circuit may be configured to map a result of the addition to a log-likelihood ratio (LLR) as the third soft information.

In some embodiments, the circuit may be configured to perform a third read operation on the first cell of the cell flash memory (i.e., the target cell or page) with a third threshold voltage (e.g., $T_4$) among the plurality of threshold voltages, wherein the second threshold voltage (e.g., $T_2$) is a voltage between the first threshold voltage (e.g., $T_0$) and the third threshold voltage (e.g., $T_4$). The circuit may be configured to generate a further plurality of threshold voltage samples (e.g., the soft samples 724) corresponding to the third threshold voltage. For each of the further plurality of threshold voltage samples (e.g., the soft samples 724), the circuit may be configured to generate fourth soft information (e.g., the label $L_1$) based on a result of the second read operation (e.g., G stored in R(5)) and the first estimated interference state (e.g., $I_1$), generate fifth soft information (e.g., the label $L_2$) based on the fourth soft information (e.g., the label $L_1$), the result of the second read operation (e.g., G stored in R(5)), and the second estimated interference state (e.g., $I_2$), and generate sixth soft information (e.g., the label $L_3$) based on the fifth soft information (e.g., the label $L_2$), the result of the second read operation (e.g., G stored in R(5)), the third estimated interference state (e.g., $I_3$) and the fourth estimated interference state (e.g., $I_4$). See Equations 7-9. The circuit may be configured to decode, based on the sixth soft information (e.g., the label $L_3$), a result of the third read operation on the first cell.

With the configuration illustrated in FIG. 7, efficient sampling and soft information generation (e.g., labeling) can be performed for compensation of ICI by combining high resolution sampling (e.g., 5-bit soft samples) and interference decoupling based on the interference information, thereby obtaining a lower BER and a refined labeling (e.g., assignments of log-likelihood ratios (LLR)). Moreover, efficient compression of the soft samples and interference samples can be performed by using soft information (e.g., labels), and efficient ICI decoupling can be achieved by manipulation of soft information (e.g., labels). Furthermore, incremental compensation of ICI can be performed with multiple single level reads (of neighboring cells) and with minimal buffer requirements.

FIG. 7 illustrates a method using interference information of four states; however embodiments of the present disclosure are not limited thereto. In some embodiments, the method can be extended to M state interference, with M−1 single level reads of neighboring cells or rows and incremental compensation with M shifts (M>1). For example, the method can be extended to three state interference with two single level reads of neighboring cells or rows and incremental compensation with three shifts. In some embodiments, the method can use M state interference while performing log(M) single level reads. In some embodiments, instead of applying incremental compensation with differential shifts, given all reads together, a shift for ICI decoupling may be applied to a label.

Figure 8:
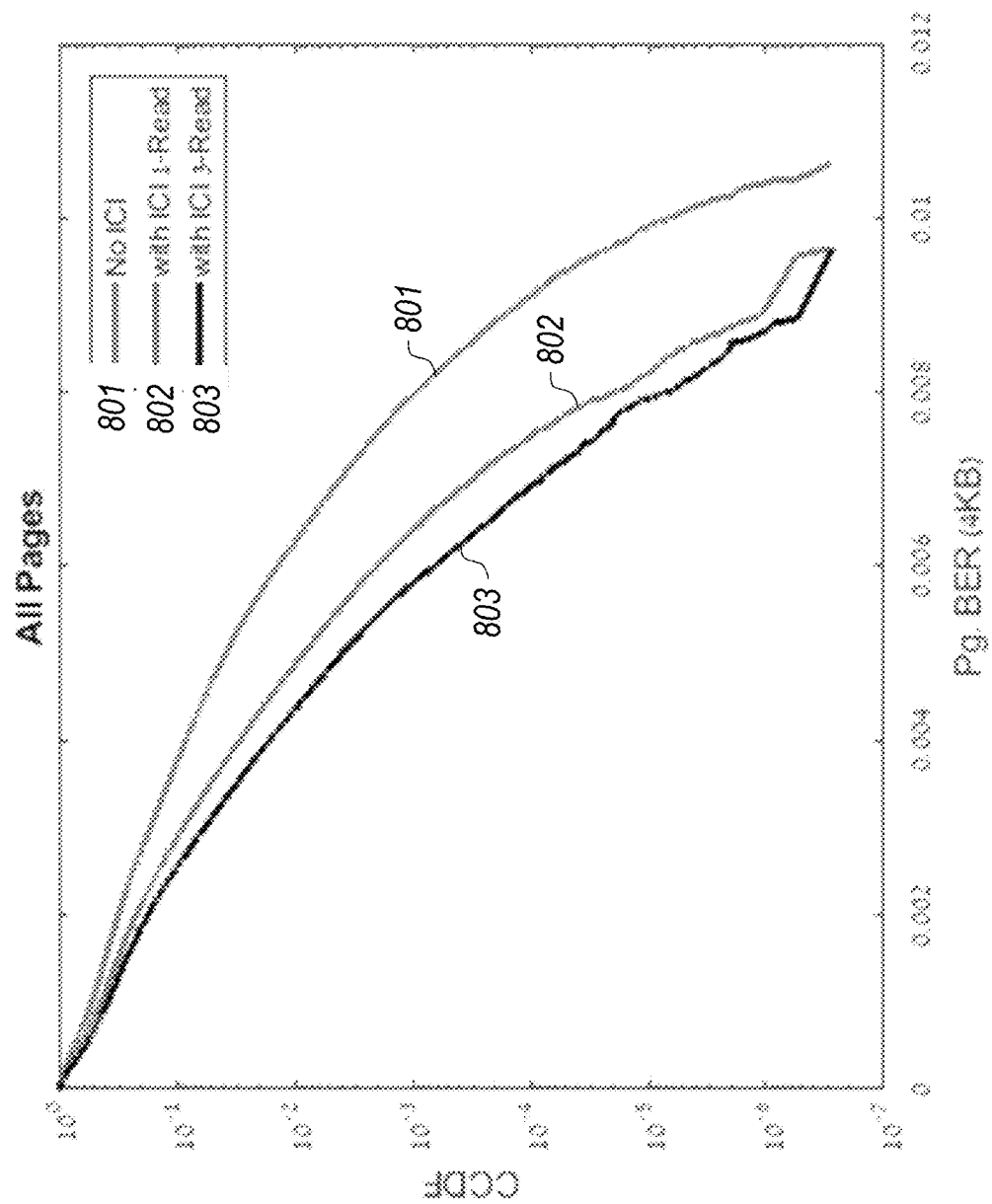
FIG. 8 is a diagram illustrating an example result of comparing (1) a decoding scheme without an ICI decoupling, (2) an ICI decoupling scheme based on two-interference states, and (3) an ICI decoupling scheme based on four-interference states, according to some embodiments.

FIG. 8 is a diagram illustrating an example result of comparing (1) a decoding scheme without an ICI decoupling (represented by the line 801), (2) an ICI decoupling scheme with a single read based on two-interference states (represented by the line 802), and (3) an ICI decoupling scheme with three single reads based on four-interference states (represented by the line 803), according to some embodiments. More particularly, FIG. 8 illustrates complementary cumulative distribution functions (CCDFs) of 4 KB codeword input raw BER when the different schemes (1)-(3) were used. It is noted that the scheme (2) corresponds to the methods illustrated in FIG. 5 and FIG. 6, and the scheme (3) corresponds to the methods illustrated in FIG. 7. It is observed that the average BER may be reduced by more than 33% in the scheme (3) for high resolution sampling and 4-state interference estimation.

Figure 9:
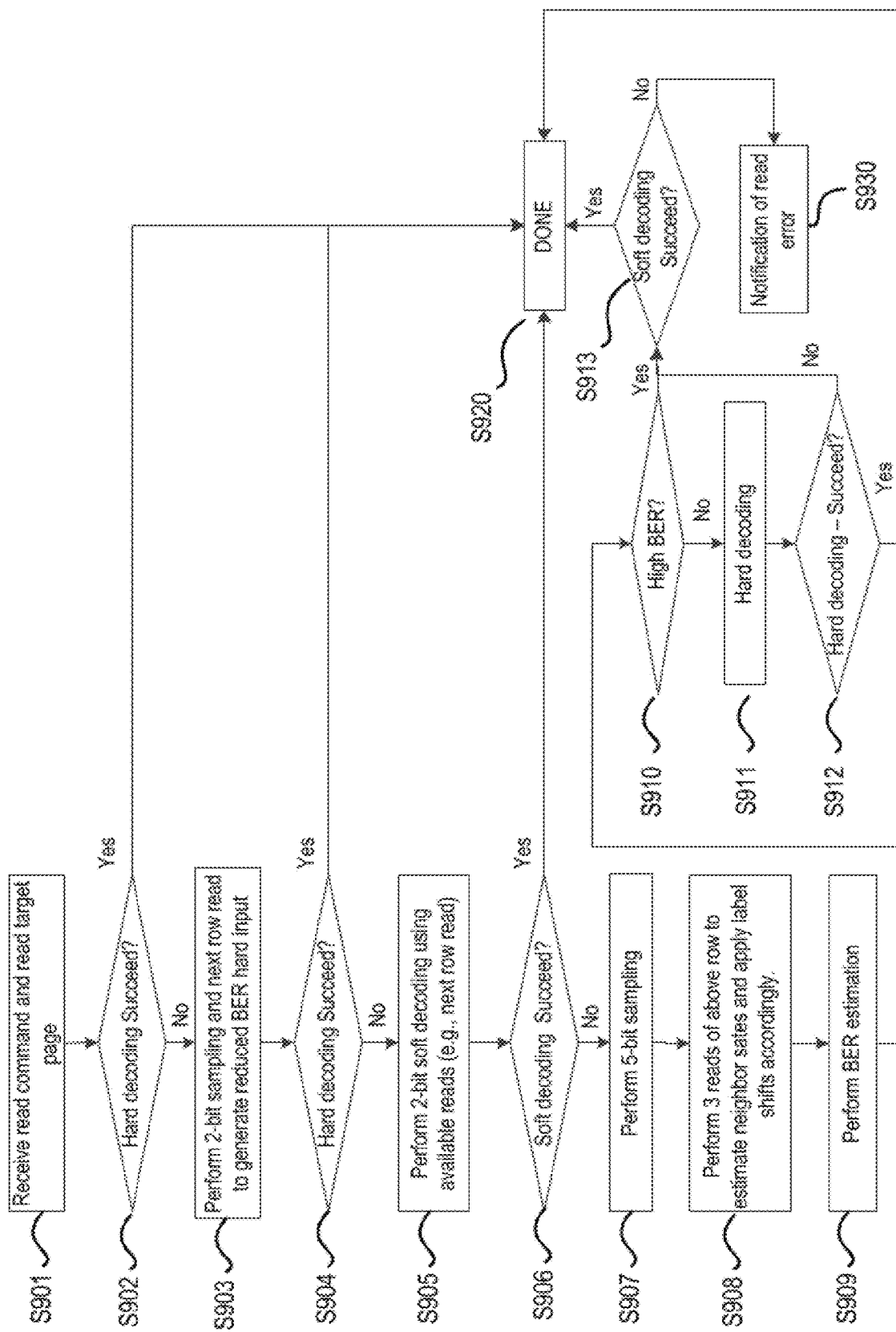
FIG. 9 is a flowchart illustrating an example methodology for performing read operations using interference information in a flash memory device according to some embodiments.

FIG. 9 is a flowchart illustrating an example methodology for performing read operations using interference information in a flash memory device according to some embodiments. More particular, FIG. 9 illustrates an exemplary read flow which incorporates the ICI compensation for hard and soft decoding (e.g., including the schemes illustrated in FIG. 5 to FIG. 7).

In this example, the process begins in step S901 by performing, upon receipt of a read command to read a target page with a first threshold voltage (e.g., $T_0$ or $T_4$), a read operation on the target page and attempting to perform a hard decoding of the read result of the target page. In some embodiments, the read command can be received in a random manner or at an arbitrary time.

In step S902, it may be determined whether the hard decoding of a read result of the target page succeeds or not. If the hard decoding fails, e.g., due to a high error rate, the process may proceed to step S903. Otherwise, if the hard decoding succeeds, the process will end at step S920.

In step S903, a method of reducing ICI with two interference states for generating hard input with reduced BER (e.g., the method illustrated in FIG. 5) may be performed. For example, a first interference state $\hat{i}_n \in \{0, 1\}$ relating to the first threshold voltage may be estimated and a first voltage shift (e.g., ΔDAC in FIG. 5) may be also estimated based on the first interference state. The first voltage shift may be estimated such that the programmed level of the neighboring cell indicated by the first interference state can cause the first voltage shift relative to the first threshold voltage. Then, a first shifted read operation on the first cell of the cell flash memory may be performed with a shifted first threshold voltage shifted with the first voltage shift (e.g., $QT(T_0)+\Delta DAC$ or $QT(T_0)-\Delta DAC$ in FIG. 5). Then, a first decoder input (e.g., the decoder hard input $C_{in}$ as shown in Equation (3)) may be generated based on the estimated first interference state (e.g., $\hat{i}_n$) and the result of the first shifted read operation on the first cell. Then, an attempt to decode the first decoder input $C_{in}$ may be made.

In step S904, it may be determined whether the hard decoding of the read result of the target page in step S903 succeeds or not. If the hard decoding fails, e.g., due to a high error rate, the process may proceed to step S905. Otherwise, if the hard decoding succeeds, the process will end at step S920.

In step S905, a method of 2-bit sampling with side information of estimated two interference states (e.g., a method similar to the method illustrated in FIG. 7 but utilizing 2-bit soft samples and one single-level read of a neighboring cell or row) may be performed. For example, four threshold voltage samples in 2-bit resolution corresponding to the first threshold voltage may be generated. For each of the four threshold voltage samples, soft information (e.g., a label similar to the label $L_1$ in Equation 7) may be generated based on a result of the second read operation (e.g., G stored in R(3) in FIG. 6) and the first estimated interference state (e.g., $\hat{i}_n \in \{0, 1\}$). Then, based on the generated soft information, an attempt to decode the result of the first read operation on the first cell may be made.

In step S906, it may be determined whether the 2-bit soft decoding of the read result of the target page in step S905 succeeds or not. If the 2-bit soft decoding fails, the process may proceed to step S907. Otherwise, if the 2-bit soft decoding succeeds, the process will end at step S920.

In step S907 and step S908, a method of 5-bit sampling with side information of estimated four interference states (e.g., a method similar to the method illustrated in FIG. 7 which utilizes 5-bit soft samples and three single-level reads of neighboring cells or rows) may be performed.

In step S907, a first plurality of threshold voltage samples (e.g., the soft samples 720 in FIG. 7) corresponding to the first threshold voltage may be generated.

In step S908, three single level reads operation on the first neighboring cell of the first cell may be performed with the first one (e.g., $T_1$), second one (e.g., $T_3$) and third one (e.g., $T_5$) of the three threshold voltages (see FIG. 7). A first interference state (e.g., $I_1$ in FIG. 7), a second interference state (e.g., $I_2$ in FIG. 7), a third interference state (e.g., $I_3$ in FIG. 7), and a fourth interference state (e.g., $I_4$ in FIG. 7) which relate to three threshold voltages (e.g., $T_1$, $T_3$, $T_5$ in FIG. 7), may be estimated. In some embodiments, a second read operation may be performed on the first cell of the cell flash memory with a second threshold voltage (e.g., $T_2$). For each of the first plurality of threshold voltage samples (e.g., the soft samples 720 in FIG. 7), first soft information (e.g., the label $L_1$) may be generated based on a result of the second read operation (e.g., G stored in R(5) in FIG. 7) and the first estimated interference state (e.g., $I_1$ in FIG. 7), generate second soft information (e.g., the label $L_2$) based on the first soft information (e.g., the label $L_1$), the result of the second read operation (e.g., G stored in R(5) in FIG. 7)), and the second estimated interference state (e.g., $I_2$ in FIG. 7) and generate third soft information (e.g., the label $L_3$) based on the second soft information (e.g., the label $L_2$), the result of the second read operation (e.g., G stored in R(5) in FIG. 7), the third estimated interference state (e.g., $I_3$ in FIG. 7) and the fourth estimated interference state (e.g., $I_4$ in FIG. 7). See Equations 7-9. Then, an attempt to decode the result of the first read operation on the first cell may be made based on the third soft information (e.g., the label $L_3$).

In step S909, BER may be measured on a result of the 5-bit soft decoding performed at step S908.

In step S910, if the result of the 5-bit soft decoding has a high BER, e.g., a BER higher than a predetermined BER threshold, the process may proceed to step S913. Otherwise, if the result of the 5-bit soft decoding has a low BER, the process will end at step S911.

In step S911, an attempt to perform a hard decoding of the read result of the target page may be made. It may be determined whether the hard decoding of the read result of the target page succeeds or not. If the hard decoding fails, e.g., due to a high error rate, the process may proceed to step S913. Otherwise, if the hard decoding succeeds, the process will end at step S920.

In step S913, an attempt to perform a soft decoding of the read result of the target page may be made. It may be determined whether the soft decoding of the read result of the target page succeeds or not. If the soft decoding fails, the process may proceed to step S930. Otherwise, if the soft decoding succeeds, the process will end at step S920.

In step S930, a read error may be generated by a read circuit (e.g., the read circuit 110 in FIG. 1) so that the memory controller (e.g., the memory controller 102) is notified of the read error.

Figure 10:
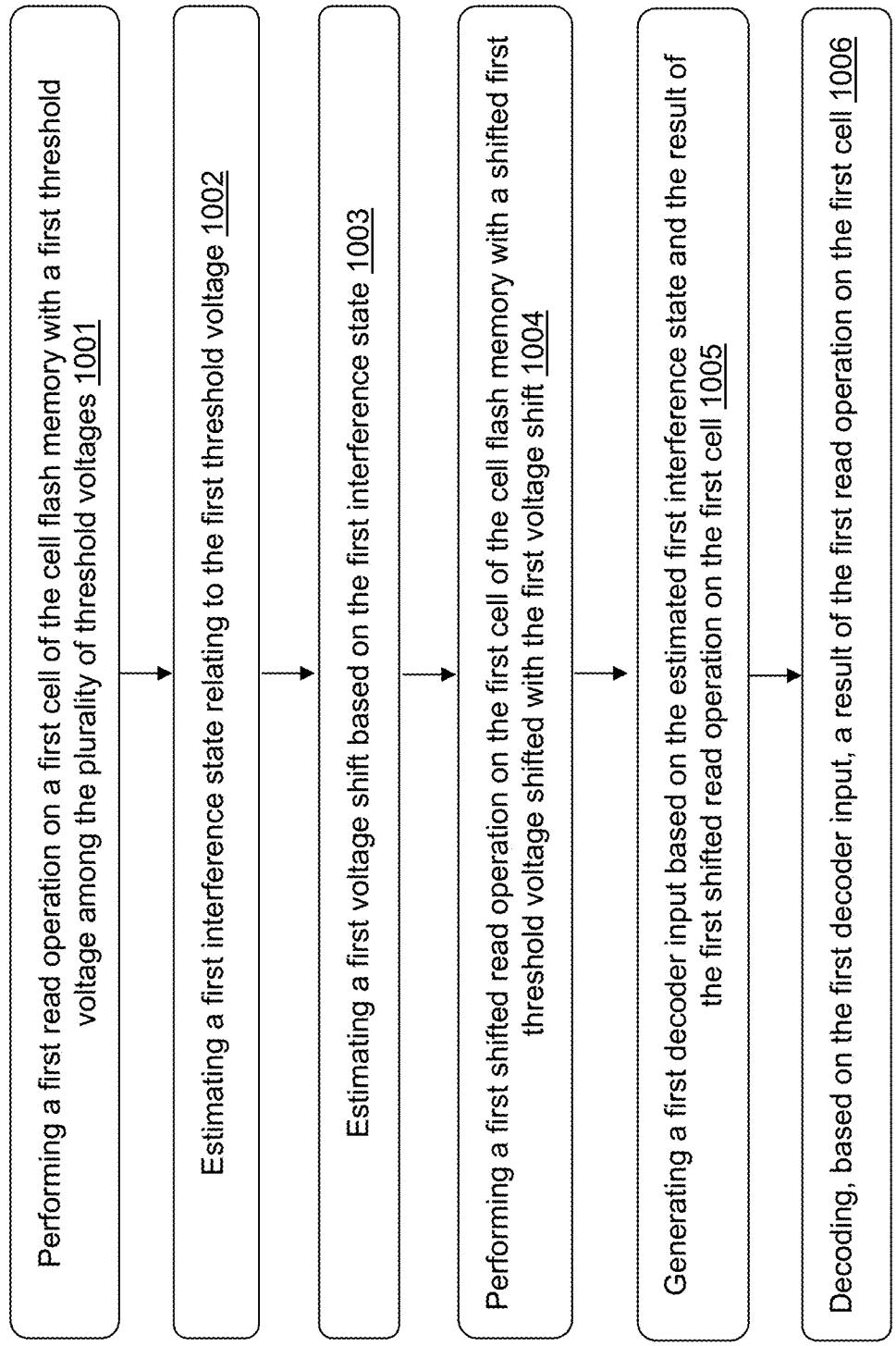
FIG. 10 is a flowchart illustrating an example methodology for decoding results of read operations using interference information in a flash memory device according to some embodiments.

FIG. 10 is a flowchart illustrating an example methodology for decoding results of read operations using interference information in a flash memory device according to some embodiments. More particularly, another example method for decoding results of read operations using interference information, similar to step S903 in FIG. 9 will be described in connection with the flowchart of FIG. 10.

In this example, the process begins in step S1001 by performing a first read operation on a first cell (e.g., the target cell) of the cell flash memory (e.g., the flash memory module 104 in FIG. 1) with a first threshold voltage (e.g., $T_0$ in FIG. 5) among the plurality of threshold voltages (e.g., $T_0$, $T_1$, ..., $T_6$ in FIG. 5). In some embodiments, a second read operation may be performed on the first cell of the cell flash memory with a second threshold voltage (e.g., $T_4$ in FIG. 5) among the plurality of threshold voltages.

In step S1002, a first interference state (e.g., $\hat{i}_n \in \{0, 1\}$) relating to the first threshold voltage (e.g., $T_0$ in FIG. 5) may be estimated. In estimating the first interference state, a single level read operation may be performed on a neighboring cell of the first cell. The first interference state may be estimated based on side information (see FIG. 3) of a programmed level of the neighboring cell relative to the first threshold voltage, so that the first interference state indicates whether the programmed level of the neighboring cell can cause a voltage shift relative to the first threshold voltage of the first cell. In some embodiments, a second interference state (e.g., $\hat{i}_n \in \{0, 1\}$) relating to the second threshold voltage (e.g., $T_4$ in FIG. 5) may be estimated.

In step S1003, a first voltage shift (e.g., $\Delta DAC$ in FIG. 5) may be estimated based on the first interference state. The first voltage shift may be estimated such that the programmed level of the neighboring cell indicated by the first interference state can cause the first voltage shift relative to the first threshold voltage. In estimating the first voltage shift, an offline statistical modeling and characterization may be performed using a conditional voltage threshold distribution. The first voltage shift may be estimated based on a result of the offline statistical modeling and characterization. In some embodiments, a second voltage shift relating to the second interference state may be estimated.

In step S1004, a first shifted read operation may be performed on the first cell of the cell flash memory with a shifted first threshold voltage shifted with the first voltage shift (e.g., $QT(T_0)-\Delta DAC$ and $QT(T_0)+\Delta DAC$ in FIG. 5). In some embodiments, a second shifted read operation may be performed on the first cell of the cell flash memory with a shifted second threshold voltage shifted with the second voltage shift (e.g., $QT(T_4)-\Delta DAC$ and $QT(T_4)+\Delta DAC$ in FIG. 5).

In step S1005, a first decoder input (e.g., $C_{in}$ in Equation 3) may be generated based on the estimated first interference state (e.g., $\hat{i}_n \in \{0, 1\}$) and the result of the first shifted read operation on the first cell (e.g., using $QT(T_0)-\Delta DAC$ and $QT(T_0)+\Delta DAC$ in FIG. 5). In some embodiments, a third read operation may be performed on the first cell of the cell flash memory with a third threshold voltage (e.g., $T_2$ in FIG. 6) among the plurality of threshold voltages. The third threshold voltage (e.g., $T_2$ in FIG. 6) may be a voltage between first threshold voltage (e.g., $T_0$ in FIG. 6) and second threshold voltage (e.g., $T_4$ in FIG. 6). First soft information (e.g., the label 601 in FIG. 6) may be generated by mapping a pair of (1) each of read values from the first read operation (e.g., R(0) in FIG. 6), the shifted first read operation (e.g., R(1), R(2) in FIG. 6), and the third read operation (e.g., R(3) in FIG. 6) and (2) the estimated first interference state to a log-likelihood ratio (LLR) as the first soft information (e.g., I=0 or 1). The result of the first read operation on the first cell may be decoded based on the first soft information (e.g., the label 601 in FIG. 6). In some embodiments, second soft information (e.g., the label 602) may be generated by mapping a pair of (1) each of read values from the second read operation (e.g., R(0) in FIG. 6), the shifted second read operation (e.g., R(1), R(2) in FIG. 6), and the third read operation (e.g., R(3) in FIG. 6) and (2) the estimated second interference state (e.g., I=0 or 1) to an LLR as the second soft information. The result of the second read operation on the first cell may be decoded based on the second soft information (e.g., the label 602). A second decoder input (e.g., $C_{in}$ in Equation 3) may be generated based on the estimated second interference state (e.g., $\hat{i}_n \in \{0, 1\}$) and the result of the second shifted read operation on the first cell (e.g., using $QT(T_4)-\Delta DAC$ and $QT(T_4)+\Delta DAC$ in FIG. 5).

In step S1006, decoding, based on the first decoder input (e.g., $C_{in}$ in Equation 3), a result of the first read operation on the first cell. In some embodiments, a result of the second read operation on the first cell may be decoded based on the second decoder input (e.g., $C_{in}$ in Equation 3).

Figure 11:
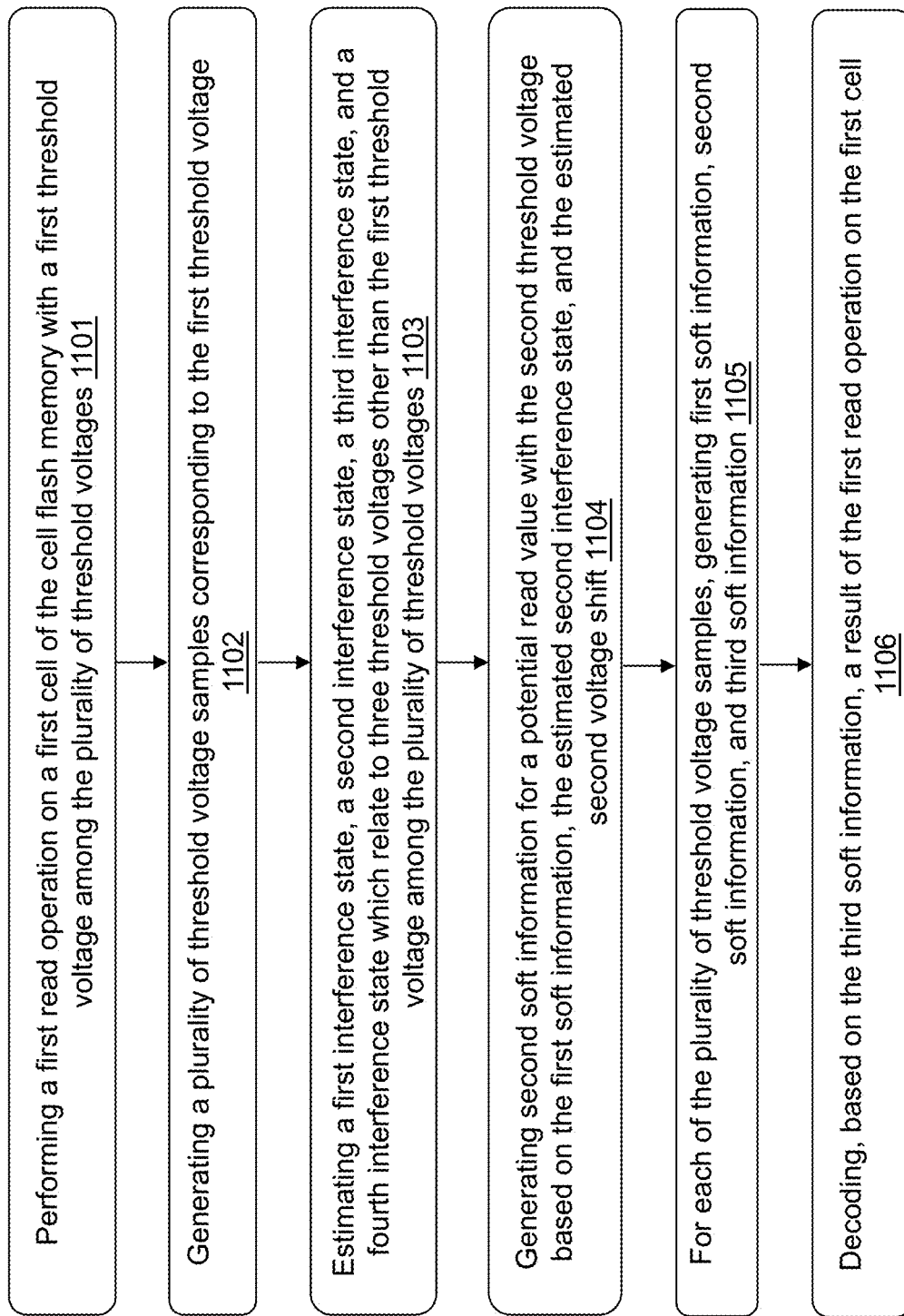
FIG. 11 is a flowchart illustrating an example methodology for decoding results of read operations using interference information in a flash memory device according to some embodiments.

FIG. 11 is a flowchart illustrating an example methodology for decoding results of read operations using interference information in a flash memory device according to some embodiments. More particularly, another example method for decoding results of read operations using interference information, similar to steps S905-S908 in FIG. 9 will be described in connection with the flowchart of FIG. 11.

In this example, the process begins in step S1101 by performing a first read operation on a first cell of the cell flash memory (e.g., the flash memory module 104 in FIG. 1) with a first threshold voltage (e.g., $T_0$) among a plurality of threshold voltages (e.g., $T_0$, $T_1$, ..., $T_6$ in FIG. 7). A third read operation may be performed on the first cell of the cell flash memory with a third threshold voltage (e.g., $T_4$) among the plurality of threshold voltages.

In step S1102, a first plurality of threshold voltage samples (e.g., the soft samples 720 in FIG. 7) may be generated corresponding to the first threshold voltage. In generating the first plurality of threshold voltage samples, a first number of bits soft decoding of the result of the first read operation on the first cell (e.g., soft decoding similar to the method illustrated in FIG. 7 but utilizing 2-bit soft samples) may be performed. It may be determined whether the first number of bits soft decoding succeeds. Responsive to determination that the first number of bits soft decoding does not succeed, the first plurality of threshold voltage samples (e.g., the soft samples 720 in FIG. 7) may be generated. The number of the first plurality of threshold voltage samples may be represented with a second number of bits (e.g., the soft samples 720 is represented with 5 bits). The second number may be greater than the first number (5-bit is greater than 2-bit). In some embodiments, a further plurality of threshold voltage samples (e.g., the soft samples 724 in FIG. 7) may be generated corresponding to the third threshold voltage (e.g., $T_4$).

In step S1103, a first interference state (e.g., $I_1$), a second interference state (e.g., $I_2$), a third interference state (e.g., $I_3$), and a fourth interference state (e.g., $I_4$) which relate to three threshold voltages (e.g., $T_1$, $T_3$, $T_5$ in FIG. 7) other than the first threshold voltage among the plurality of threshold voltages, may be estimated. In some embodiments, a first one (e.g., $T_1$) of the three threshold voltages (e.g., $T_1$, $T_3$, $T_5$ in FIG. 7) may be lower than a second one (e.g., $T_3$) of the three threshold voltages which is lower than a third one (e.g., $T_5$) of the three threshold voltages. In estimating the first, second, third and fourth interference states (e.g., $I_1$~$I_4$), a single level read operation may be performed on a first neighboring cell of the first cell with each of the first one (e.g., $T_1$), second one (e.g., $T_3$) and third one (e.g., $T_5$) of the three threshold voltages. The first, second and third interference states (e.g., $I_1$~$I_3$) may be estimated based on side information of a programmed level of the first neighboring cell relative to the first one (e.g., $T_1$), second one (e.g., $T_3$) and third one (e.g., $T_5$) of the three threshold voltages, respectively, so that the first, second and third interference states indicate whether the programmed level of the first neighboring cell can cause a voltage shift relative to the first one, second one and third one of the three threshold voltages of the first cell, respectively. The fourth interference state (e.g., $I_4$) may be estimated based on side information of a programmed level of the first neighboring cell relative to the third one (e.g., $T_5$) of the three threshold voltages, so that the fourth interference state indicates whether the programmed level of the first neighboring cell can cause a voltage shift relative to the third one (e.g., $T_5$) of the three threshold voltages of the first cell.

In step S1104, a second read operation may be performed on the first cell of the cell flash memory with a second threshold voltage (e.g., $T_2$) among the plurality of threshold voltages. The second threshold voltage (e.g., $T_2$) may be a voltage between the first threshold voltage (e.g., $T_0$) and the third threshold voltage (e.g., $T_4$). See FIG. 7.

In step S1105, for each of the first plurality of threshold voltage samples (e.g., the soft samples 720 in FIG. 7), first soft information (e.g., the label $L_1$ in Equation 7), second soft information (e.g., the label $L_2$ in Equation 8), and third soft information (e.g., the label $L_3$ in Equation 8) may be generated. For each of the first plurality of threshold voltage samples, the first soft information (e.g., the label $L_1$) may be generated based on a result of the second read operation (e.g., G stored in R(5) in FIG. 7) and the first estimated interference state (e.g., $I_1$ in FIG. 7) the second soft information (e.g., the label $L_2$) may be generated based on the first soft information (e.g., the label $L_1$), the result of the second read operation (e.g., G stored in R(5) in FIG. 7), and the second estimated interference state (e.g., $I_2$ in FIG. 7), and the third soft information (e.g., the label $L_3$) may be generated based on the second soft information (e.g., the label $L_2$), the result of the second read operation (e.g., G stored in R(5) in FIG. 7), the third estimated interference state (e.g., $I_3$ in FIG. 7) and the fourth estimated interference state (e.g., $I_4$ in FIG. 7).

In some embodiments, in generating the first soft information (e.g., the label $L_1$), a first voltage shift (e.g., the shift $\Delta_1$ in FIG. 7) representing a voltage value mitigating an interference corresponding to the first estimated interference state may be estimated based on the first estimated interference state (e.g., $I_1$). An amount of the first voltage shift (e.g., $I\cdot(2G-1)\cdot\Delta_1$) may be added to a quantized value of each of the first plurality of threshold voltage samples (e.g., $L_0$=R(0)~R(4)). See Equation 7.

In some embodiments, in generating the second soft information (e.g., the label $L_2$), a second voltage shift (e.g., the shift $\Delta_2$ in FIG. 7) representing a voltage value mitigating an interference corresponding to the second estimated interference state may be estimated based on the second estimated interference state. An amount of the second voltage shift (e.g., $(2G-1)\cdot\Delta_2$) may be added to a quantized value of the first soft information (e.g., the label $L_1$). See Equation 8.

In some embodiments, in generating the third soft information (e.g., the label $L_3$), a third voltage shift and a fourth voltage shift (e.g., the shifts $\Delta_3$ and $\Delta_4$ in FIG. 7) respectively representing a voltage value mitigating an interference corresponding to the third and fourth estimated interference states may be estimated based on the third and fourth estimated interference states (e.g., $I_3$ and $I_4$). An amount of the third voltage shift and an amount of the fourth voltage shift (e.g., $(2G-1)\cdot(\Delta_3+(1-I_3)\cdot\Delta_4)$) may be added to a quantized value of the second soft information (e.g., the label $L_2$). See Equation 9. A result of the addition may be mapped to a log-likelihood ratio (LLR) as the third soft information (e.g., the label $L_3$).

In some embodiments, for each of the further plurality of threshold voltage samples (e.g., the soft samples 724 in FIG. 7), fourth soft information (e.g., the label $L_1$) may be generated based on a result of the second read operation (e.g., G stored in R(5) in FIG. 7) and the first estimated interference state (e.g., $I_1$), fifth soft information (e.g., the label $L_2$) may be generated based on the fourth soft information (e.g., the label $L_1$), the result of the second read operation (e.g., G stored in R(5) in FIG. 7), and the second estimated interference state (e.g., $I_2$), and sixth soft information (e.g., the label $L_3$) may be generated based on the fifth soft information (e.g., the label $L_2$), the result of the second read operation (e.g., G stored in R(5) in FIG. 7), the third estimated interference state (e.g., $I_3$) and the fourth estimated interference state (e.g., 14).

In step S1106, based on the third soft information (e.g., the label $L_3$), a result of the first read operation on the first cell may be decoded. In some embodiments, a result of the third read operation on the first cell may be decoded based on the sixth soft information (e.g., the label $L_3$).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations on a cell flash memory having a plurality of threshold voltages, the method comprising:
    performing a first read operation on a first cell of the cell flash memory with a first threshold voltage among the plurality of threshold voltages;
    estimating a first interference state relating to the first threshold voltage;
    estimating a first voltage shift based on the first interference state;

performing a first shifted read operation on the first cell of the cell flash memory with a shifted first threshold voltage shifted with the first voltage shift;

generating a first decoder input based on the estimated first interference state and the result of the first shifted read operation on the first cell; and decoding, based on the first decoder input, a result of the first read operation on the first cell.

2. The method of claim 1, wherein the estimating the first interference state includes:

performing a single level read operation on a neighboring cell of the first cell; and estimating the first interference state based on side information of a programmed level of the neighboring cell relative to the first threshold voltage, so that the first interference state indicates whether the programmed level of the neighboring cell can cause a voltage shift relative to the first threshold voltage of the first cell.

3. The method of claim 1, wherein the estimating the first voltage shift includes:

estimating the first voltage shift such that a programmed level indicated by the first interference state can cause the first voltage shift relative to the first threshold voltage.

4. The method of claim 1, further comprising:

performing a second read operation on the first cell of the cell flash memory with a second threshold voltage among the plurality of threshold voltages;

estimating a second interference state relating to the second threshold voltage;

estimating a second voltage shift based on the second interference state;

performing a second shifted read operation on the first cell of the cell flash memory with a shifted second threshold voltage shifted with the second voltage shift;

generating a second decoder input based on the estimated second interference state and the result of the second shifted read operation on the first cell; and decoding, based on the second decoder input, a result of the second read operation on the first cell.

5. The method of claim 4, further comprising:

performing a third read operation on the first cell of the cell flash memory with a third threshold voltage among the plurality of threshold voltages, wherein the third threshold voltage is a voltage between first threshold voltage and second threshold voltage;

generating first soft information by mapping a pair of (1) each of read values from the first read operation, the shifted first read operation, and the third read operation and (2) the estimated first interference state to a log-likelihood ratio (LLR) as the first soft information;

decoding, based on the first soft information, the result of the first read operation on the first cell;

generating second soft information by mapping a pair of (1) each of read values from the second read operation, the shifted second read operation, and the third read operation and (2) the estimated second interference state to an LLR as the second soft information; and decoding, based on the second soft information, the result of the second read operation on the first cell.

6. A method for performing operations on a cell flash memory having a plurality of threshold voltages, the method comprising:

performing a first read operation on a first cell of the cell flash memory with a first threshold voltage among the plurality of threshold voltages;

generating a first plurality of threshold voltage samples corresponding to the first threshold voltage;

estimating a first interference state, a second interference state, a third interference state, and a fourth interference state which relate to three threshold voltages other than the first threshold voltage among the plurality of threshold voltages;

performing a second read operation on the first cell of the cell flash memory with a second threshold voltage among the plurality of threshold voltages;

for each of the first plurality of threshold voltage samples:
generating first soft information based on a result of the second read operation and the first estimated interference state,
generating second soft information based on the first soft information, the result of the second read operation, and the second estimated interference state, and
generating third soft information based on the second soft information, the result of the second read operation, the third estimated interference state and the fourth estimated interference state; and decoding, based on the third soft information, a result of the first read operation on the first cell.

7. The method of claim 6, wherein a first one of the three threshold voltages is lower than a second one of the three threshold voltages which is lower than a third one of the three threshold voltages, wherein the estimating the first, second, third and fourth interference states includes:

performing a single level read operation on a first neighboring cell of the first cell with each of the first one, second one and third one of the three threshold voltages; and estimating the first, second and third interference states based on side information of a programmed level of the first neighboring cell relative to the first one, second one and third one of the three threshold voltages, respectively, so that the first, second and third interference states indicate whether the programmed level of the first neighboring cell can cause a voltage shift relative to the first one, second one and third one of the three threshold voltages of the first cell, respectively; and estimating the fourth interference state based on side information of a programmed level of the first neighboring cell relative to the third one of the three threshold voltages, so that the fourth interference state indicates whether the programmed level of the first neighboring cell can cause a voltage shift relative to the third one of the three threshold voltages of the first cell.

8. The method of claim 6, wherein the generating the first plurality of threshold voltage samples includes performing a first number of bits soft decoding of the result of the first read operation on the first cell;

determining whether the first number of bits soft decoding succeeds; and responsive to determination that the first number of bits soft decoding does not succeed, generating the first plurality of threshold voltage samples whose number is represented with a second number of bits, wherein the second number is greater than the first number.

9. The method of claim 6, wherein the generating the first soft information includes:
estimating, based on the first estimated interference state, a first voltage shift representing a voltage value mitigating an interference corresponding to the first estimated interference state; and adding an amount of the first voltage shift to a quantized value of each of the first plurality of threshold voltage samples,
wherein the generating the second soft information includes:
estimating, based on the second estimated interference state, a second voltage shift representing a voltage value mitigating an interference corresponding to the second estimated interference state; and
adding an amount of the second voltage shift to a quantized value of the first soft information,
wherein the generating the third soft information includes:
estimating, based on the third and fourth estimated interference states, a third voltage shift and a fourth voltage shift respectively representing a voltage value mitigating an interference corresponding to the third and fourth estimated interference states;
adding an amount of the third voltage shift and an amount of the fourth voltage shift to a quantized value of the second soft information; and
mapping a result of the addition to a log-likelihood ratio (LLR) as the third soft information.

10. The method of claim 6, further comprising:
performing a third read operation on the first cell of the cell flash memory with a third threshold voltage among the plurality of threshold voltages, wherein the second threshold voltage is a voltage between the first threshold voltage and the third threshold voltage;
generating a further plurality of threshold voltage samples corresponding to the third threshold voltage;
for each of the further plurality of threshold voltage samples:
generating fourth soft information based on a result of the second read operation and the first estimated interference state,
generating fifth soft information based on the fourth soft information, the result of the second read operation, and the second estimated interference state, and
generating sixth soft information based on the fifth soft information, the result of the second read operation, the third estimated interference state and the fourth estimated interference state; and
decoding, based on the sixth soft information, a result of the third read operation on the first cell.

11. A flash memory system comprising:
a cell flash memory having a plurality of threshold voltages; and
a circuit for performing operations of the cell flash memory, the circuit being configured to:
perform a first read operation on a first cell of the cell flash memory with a first threshold voltage among the plurality of threshold voltages;
estimate a first interference state relating to the first threshold voltage;
estimate a first voltage shift based on the first interference state;
perform a first shifted read operation on the first cell of the cell flash memory with a shifted first threshold voltage shifted with the first voltage shift;
generate a first decoder input based on the estimated first interference state and the result of the first shifted read operation on the first cell; and
decode, based on the first decoder input, a result of the first read operation on the first cell.

12. The flash memory system of claim 11, wherein in estimating the first interference state, the circuit is further configured to:

perform a single level read operation on a neighboring cell of the first cell; and
estimate the first interference state based on side information of a programmed level of the neighboring cell relative to the first threshold voltage, so that the first interference state indicates whether the programmed level of the neighboring cell can cause a voltage shift relative to the first threshold voltage of the first cell.

13. The flash memory system of claim 11, wherein in estimating the first voltage shift, the circuit is further configured to:
estimate the first voltage shift such that a programmed level indicated by the first interference state can cause the first voltage shift relative to the first threshold voltage.

14. The flash memory system of claim 11, wherein the circuit is further configured to:
perform a second read operation on the first cell of the cell flash memory with a second threshold voltage among the plurality of threshold voltages;
estimate a second interference state relating to the second threshold voltage;
estimate a second voltage shift based on the second interference state;
perform a second shifted read operation on the first cell of the cell flash memory with a shifted second threshold voltage shifted with the second voltage shift;
generate a second decoder input based on the estimated second interference state and the result of the second shifted read operation on the first cell; and
decode, based on the second decoder input, a result of the second read operation on the first cell.

15. The flash memory system of claim 14, wherein the circuit is further configured to:
perform a third read operation on the first cell of the cell flash memory with a third threshold voltage among the plurality of threshold voltages, wherein the third threshold voltage is a voltage between first threshold voltage and second threshold voltage;
generate first soft information by mapping a pair of (1) each of read values from the first read operation, the shifted first read operation, and the third read operation and (2) the estimated first interference state to a log-likelihood ratio (LLR) as the first soft information;
decode, based on the first soft information, the result of the first read operation on the first cell;
generate second soft information by mapping a pair of (1) each of read values from the second read operation, the shifted second read operation, and the third read operation and (2) the estimated second interference state to an LLR as the second soft information; and
decode, based on the second soft information, the result of the second read operation on the first cell.

16. A flash memory system comprising:
a cell flash memory having a plurality of threshold voltages; and
a circuit for performing operations of the cell flash memory, the circuit being configured to:
perform a first read operation on a first cell of the cell flash memory with a first threshold voltage among the plurality of threshold voltages;
generate a first plurality of threshold voltage samples corresponding to the first threshold voltage;
estimate a first interference state, a second interference state, a third interference state, and a fourth interference state which relate to three threshold voltages other than the first threshold voltage among the plurality of threshold voltages;

perform a second read operation on the first cell of the cell flash memory with a second threshold voltage among the plurality of threshold voltages;

for each of the first plurality of threshold voltage samples:

generate first soft information based on a result of the second read operation and the first estimated interference state, generate second soft information based on the first soft information, the result of the second read operation, and the second estimated interference state, and generate third soft information based on the second soft information, the result of the second read operation, the third estimated interference state and the fourth estimated interference state; and decode, based on the third soft information, a result of the first read operation on the first cell.

17. The flash memory system of claim 16, wherein a first one of the three threshold voltages is lower than a second one of the three threshold voltages which is lower than a third one of the three threshold voltages, wherein in estimating the first, second, third and fourth interference states, the circuit is further configured to:

perform a single level read operation on a first neighboring cell of the first cell with each of the first one, second one and third one of the three threshold voltages; and estimate the first, second and third interference states based on side information of a programmed level of the first neighboring cell relative to the first one, second one and third one of the three threshold voltages, respectively, so that the first, second and third interference states indicate whether the programmed level of the first neighboring cell can cause a voltage shift relative to the first one, second one and third one of the three threshold voltages of the first cell, respectively; and estimate the fourth interference state based on side information of a programmed level of the first neighboring cell relative to the third one of the three threshold voltages, so that the fourth interference state indicates whether the programmed level of the first neighboring cell can cause a voltage shift relative to the third one of the three threshold voltages of the first cell.

18. The flash memory system of claim 16, wherein in generating the first plurality of threshold voltage samples, the circuit is further configured to:

perform a first number of bits soft decoding of the result of the first read operation on the first cell;

determine whether the first number of bits soft decoding succeeds; and responsive to determination that the first number of bits soft decoding does not succeed, generate the first plurality of threshold voltage samples whose number is represented with a second number of bits, wherein the second number is greater than the first number.

19. The flash memory system of claim 16, wherein in generating the first soft information, the circuit is further configured to:

estimate, based on the first estimated interference state, a first voltage shift representing a voltage value mitigating an interference corresponding to the first estimated interference state; and add an amount of the first voltage shift to a quantized value of each of the first plurality of threshold voltage samples, wherein in generating the second soft information, the circuit is further configured to:

estimate, based on the second estimated interference state, a second voltage shift representing a voltage value mitigating an interference corresponding to the second estimated interference state; and add an amount of the second voltage shift to a quantized value of the first soft information, wherein in generating the third soft information, the circuit is further configured to:

estimate, based on the third and fourth estimated interference states, a third voltage shift and a fourth voltage shift respectively representing a voltage value mitigating an interference corresponding to the third and fourth estimated interference states;

add an amount of the third voltage shift and an amount of the fourth voltage shift to a quantized value of the second soft information; and map a result of the addition to a log-likelihood ratio (LLR) as the third soft information.

20. The flash memory system of claim 16, wherein the circuit is further configured to:

perform a third read operation on the first cell of the cell flash memory with a third threshold voltage among the plurality of threshold voltages, wherein the second threshold voltage is a voltage between the first threshold voltage and the third threshold voltage;

generate a further plurality of threshold voltage samples corresponding to the third threshold voltage;

for each of the further plurality of threshold voltage samples:

generate fourth soft information based on a result of the second read operation and the first estimated interference state, generate fifth soft information based on the fourth soft information, the result of the second read operation, and the second estimated interference state, and generate sixth soft information based on the fifth soft information, the result of the second read operation, the third estimated interference state and the fourth estimated interference state; and decode, based on the sixth soft information, a result of the third read operation on the first cell.

* * * * *